(12) United States Patent
Takahashi et al.

(10) Patent No.: US 11,699,601 B2
(45) Date of Patent: Jul. 11, 2023

(54) SUBSTRATE PROCESSING METHOD

(71) Applicant: SCREEN Holdings Co., Ltd., Kyoto (JP)

(72) Inventors: Tomohiro Takahashi, Kyoto (JP); Kei Takechi, Kyoto (JP); Mitsutoshi Sasaki, Kyoto (JP); Takashi Akiyama, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 17/359,629

(22) Filed: Jun. 27, 2021

(65) Prior Publication Data

US 2021/0327729 A1 Oct. 21, 2021

Related U.S. Application Data

(62) Division of application No. 16/551,707, filed on Aug. 26, 2019, now abandoned.

(30) Foreign Application Priority Data

Sep. 21, 2018 (JP) .................................. 2018-177250

(51) Int. Cl.
*H01L 21/67* (2006.01)
*H01L 21/02* (2006.01)
(Continued)

(52) U.S. Cl.
CPC .. *H01L 21/67086* (2013.01); *H01L 21/02052* (2013.01); *H01L 21/02343* (2013.01);
(Continued)

(58) Field of Classification Search
CPC ......... H01L 21/67086; H01L 21/67757; H01L 21/6708; H01L 21/67017; H01L 21/6715;
(Continued)

(56) References Cited

U.S. PATENT DOCUMENTS 8,043,468 B2 10/2011 Osawa et al.
10,483,137 B2 11/2019 Masutomi et al.
(Continued)

FOREIGN PATENT DOCUMENTS

JP 2001196343 7/2001
JP 2007300118 11/2007
(Continued)

*Primary Examiner* — Ahmed N Sefer
(74) *Attorney, Agent, or Firm* — JCIPRNET

(57) ABSTRACT

A substrate processing device includes a processing tank, a substrate holding unit, a fluid supply unit, and a control unit. The processing tank stores a processing liquid for processing a substrate. The substrate holding unit holds the substrate in the processing liquid in the processing tank. The fluid supply unit supplies a fluid to the processing tank. The control unit controls the fluid supply unit. The control unit controls the fluid supply unit such that the fluid supply unit changes supply of the fluid during a period from a start of supply of the fluid to the processing tank storing the processing liquid in which the substrate is immersed to an end of supply of the fluid to the processing tank storing the processing liquid in which the substrate is immersed.

7 Claims, 23 Drawing Sheets

(51) Int. Cl.
*H01L 21/677* (2006.01)
*H01L 21/302* (2006.01)

(52) U.S. Cl.
CPC ........ *H01L 21/302* (2013.01); *H01L 21/6708* (2013.01); *H01L 21/6715* (2013.01); *H01L 21/67017* (2013.01); *H01L 21/67253* (2013.01); *H01L 21/67259* (2013.01); *H01L 21/67757* (2013.01)

(58) Field of Classification Search
CPC ............. H01L 21/302; H01L 21/67057; H01L 21/02052; H01L 21/02343; H01L 21/67253; H01L 21/67259
See application file for complete search history.

(56) References Cited

U.S. PATENT DOCUMENTS

| | | | |
|---|---|---|---|
| 11,309,194 B2 | 4/2022 | Tanaka et al. | |
| 2006/0112973 A1* | 6/2006 | Nagami | C03C 23/0075 257/E21.228 |
| 2008/0023444 A1* | 1/2008 | Osawa | H01L 21/6708 156/345.15 |
| 2010/0032410 A1* | 2/2010 | Ootaguro | H01L 21/67086 427/430.1 |
| 2011/0290279 A1* | 12/2011 | Hyakutake | H01L 21/67109 134/105 |
| 2011/0309051 A1 | 12/2011 | Choi et al. | |
| 2014/0182626 A1* | 7/2014 | Hayashi | H01L 21/67051 134/18 |
| 2018/0025927 A1* | 1/2018 | Masutomi | H01L 21/67313 438/704 |
| 2018/0261479 A1* | 9/2018 | Ito | H01L 21/67248 |
| 2019/0080937 A1* | 3/2019 | Tsuchiya | H01L 21/67057 |

FOREIGN PATENT DOCUMENTS

| | | |
|---|---|---|
| JP | 2008010495 | 1/2008 |
| JP | 2017069383 | 4/2017 |
| JP | 2017069529 | 4/2017 |
| JP | 2018014470 | 1/2018 |
| KR | 20090031988 | 3/2009 |
| KR | 20100050404 | 5/2010 |
| KR | 20180089864 | 8/2018 |

* cited by examiner

SUBSTRATE PROCESSING METHOD

CROSS-REFERENCE TO RELATED APPLICATION

This application is a divisional application of and claims the priority benefit of a prior application Ser. No. 16/551,707, filed on Aug. 26, 2019, now pending. The prior application Ser. No. 16/551,707 claims the priority benefit of Japanese Patent Application No. 2018-177250, filed on Sep. 21, 2018. The entirety of each of the above-mentioned patent applications is hereby incorporated by reference herein and made a part of this specification.

BACKGROUND

Technical Field

A subject of this application relates to a substrate processing device and a substrate processing method.

Description of Related Art

It is known that substrates used in electronic components such as semiconductor devices and liquid crystal display devices are processed by substrate processing devices. Processing of a substrate is performed by immersing the substrate in a processing liquid inside a processing tank.

In this case, in a substrate processing device, when a substrate is processed using a phosphoric acid aqueous solution, air bubbles are generated by spraying a mixed gas into the phosphoric acid aqueous solution such that the phosphoric acid aqueous solution is subjected to aeration agitation.

SUMMARY

According to an embodiment, there is provided a substrate processing device including a processing tank that stores a processing liquid for processing a substrate, a substrate holding unit that holds the substrate in the processing liquid in the processing tank, a fluid supply unit that supplies a fluid to the processing tank, and a control unit that controls the fluid supply unit. The control unit controls the fluid supply unit such that the fluid supply unit changes supply of the fluid during a period from a start of supply of the fluid to the processing tank storing the processing liquid in which the substrate is immersed to an end of supply of the fluid to the processing tank storing the processing liquid in which the substrate is immersed.

According to another embodiment, there is provided a substrate processing method including a step of immersing a substrate in a processing liquid stored in a processing tank, and a step of supplying a fluid to the processing tank. The step of supplying a fluid includes a step of changing supply of the fluid during a period from a start of supply of the fluid to the processing tank storing the processing liquid in which the substrate is immersed to an end of supply of the fluid to the processing tank storing the processing liquid in which the substrate is immersed.

DESCRIPTION OF THE EMBODIMENTS

Figure 1:
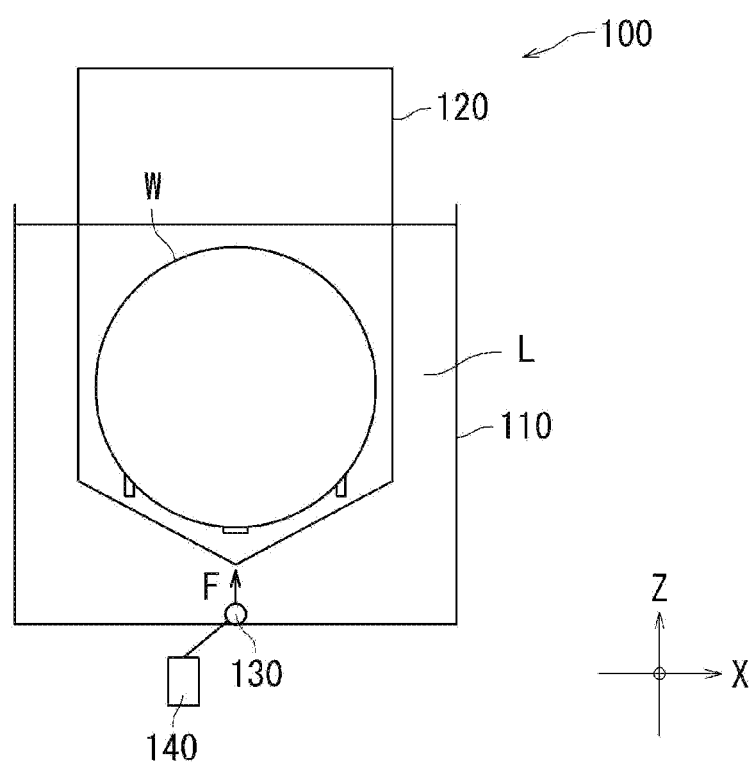
FIG. 1 is a schematic view of a substrate processing device of the present embodiment.

In the substrate processing device according to the embodiment, the fluid supply unit may include a first fluid supply unit which is disposed at a first position inside the processing tank and supplies a fluid to the processing tank, and a second fluid supply unit which is disposed at a second position inside the processing tank and supplies a fluid to the processing tank during a period different from a period during which the first fluid supply unit supplies the fluid.

In the substrate processing device according to the embodiment, the control unit may control the first fluid supply unit and the second fluid supply unit such that at least one of the fluid of the first fluid supply unit and the fluid of the second fluid supply unit is supplied to the processing tank by switching between supply of the fluid performed by the first fluid supply unit and supply of the fluid performed by the second fluid supply unit.

In the substrate processing device according to the embodiment, the first fluid supply unit may supply a gas as the fluid to the processing tank. The second fluid supply unit may supply a gas as the fluid to the processing tank.

In the substrate processing device according to the embodiment, the first fluid supply unit may have a plurality of fluid supply tubes. The plurality of fluid supply tubes of the first fluid supply unit may be symmetrically disposed with respect to a vertical central axis of the substrate.

In the substrate processing device according to the embodiment, the second fluid supply unit may have a plurality of fluid supply tubes. The plurality of fluid supply tubes of the second fluid supply unit may be symmetrically disposed with respect to a vertical central axis of the substrate.

The substrate processing device according to the embodiment may further include a liquid supply unit that is disposed below the substrate held by the substrate holding unit inside the processing tank and supplies the processing liquid to the processing tank.

In the substrate processing device according to the embodiment, the liquid supply unit may have a plurality of liquid supply tubes. The plurality of liquid supply tubes of the liquid supply unit may be symmetrically disposed with respect to a vertical central axis of the substrate.

The substrate processing device according to the embodiment may further include a liquid supply unit that is disposed below the substrate held by the substrate holding unit inside the processing tank and supplies the processing liquid to the processing tank. The liquid supply unit may include a first liquid supply tube and a second liquid supply tube. The first fluid supply unit may have a plurality of fluid supply tubes. At least one fluid supply tube of the plurality of fluid supply tubes of the first fluid supply unit may be positioned between a vertical central axis of the substrate and the first liquid supply tube. At least another fluid supply tube of the plurality of fluid supply tubes of the first fluid supply unit may be positioned between the vertical central axis of the substrate and the second liquid supply tube.

In the substrate processing device according to the embodiment, the second fluid supply unit may have a plurality of fluid supply tubes. At least one fluid supply tube of the plurality of fluid supply tubes of the second fluid supply unit may be positioned between the vertical central axis of the substrate and the first liquid supply tube. At least another fluid supply tube of the plurality of fluid supply tubes of the second fluid supply unit may be positioned between the vertical central axis of the substrate and the second liquid supply tube.

The substrate processing device according to the embodiment may further include a liquid supply unit that is disposed below the substrate held by the substrate holding unit inside the processing tank and supplies the processing liquid to the processing tank. The liquid supply unit may include a first liquid supply tube and a second liquid supply tube. The first fluid supply unit may have a plurality of fluid supply tubes. The plurality of fluid supply tubes of the first fluid supply unit may include a first fluid supply tube, a second fluid supply tube, a third fluid supply tube, and a fourth fluid supply tube. The first liquid supply tube may be positioned between the first fluid supply tube and the second fluid supply tube of the first fluid supply unit. The second liquid supply tube may be positioned between the third fluid supply tube and the fourth fluid supply tube of the first fluid supply unit.

In the substrate processing device according to the embodiment, the second fluid supply unit may have a plurality of fluid supply tubes. The plurality of fluid supply tubes of the second fluid supply unit may include a fifth fluid supply tube, a sixth fluid supply tube, a seventh fluid supply tube, and an eighth fluid supply tube. The first liquid supply tube may be positioned between the fifth fluid supply tube and the sixth fluid supply tube of the second fluid supply unit. The second liquid supply tube may be positioned between the seventh fluid supply tube and the eighth fluid supply tube of the second fluid supply unit.

In the substrate processing device according to the embodiment, the first fluid supply unit may supply a processing liquid as the fluid to the processing tank. The second fluid supply unit may supply a processing liquid as the fluid to the processing tank.

In the substrate processing device according to the embodiment, the control unit may control the fluid supply unit such that the fluid supply unit moves inside the processing tank.

In the substrate processing device according to the embodiment, a plurality of substrates may be arranged in a row. The fluid supply unit may extend in a direction intersecting a direction in which the substrates are arranged and may be positioned between two adjacent substrates of the plurality of substrates.

In the substrate processing device according to the embodiment, the fluid supply unit may supply a liquid to the two substrates.

In the substrate processing device according to the embodiment, the fluid supply unit may be disposed below the substrate held by the substrate holding unit inside the processing tank.

The substrate processing device according to the embodiment may further include a straightening plate that faces at least a part of the substrate.

In the substrate processing device according to the embodiment, the straightening plate may be attached to the processing tank or the substrate holding unit.

Hereinafter, a substrate processing device and a substrate processing method of the present embodiment will be described with reference to the drawings. In the diagrams, the same reference signs are applied to parts which are the same as or correspond to each other, and description thereof will not be repeated. In the specification of this application, in order to facilitate the understanding, an X-axis, a Y-axis, and a Z-axis which are orthogonal to one another are indicated sometimes. Typically, the X-axis and the Y-axis are parallel to the horizontal direction, and the Z-axis is parallel to the vertical direction.

With reference to FIG. 1, a substrate processing device 100 of the present embodiment will be described. FIG. 1 is a schematic view of the substrate processing device 100 of the present embodiment.

The substrate processing device 100 performs processing of a substrate W. The substrate processing device 100 performs processing of the substrate W such that the substrate W is subjected to at least one of etching, surface treatment, impartment of properties, formation of a processed film, removing of at least a part of a film, and washing.

The substrate W has a thin plate shape. Typically, the substrate W has a substantially circular thin plate shape. Examples of the substrate W include a semiconductor wafer, a substrate for a liquid crystal display device, a substrate for a plasma display, a substrate for a field emission display (FED), a substrate for an optical disc, a substrate for a magnetic disk, a substrate for a magneto-optical disc, a substrate for a photomask, a ceramic substrate, and a substrate for a solar battery.

The substrate processing device 100 performs processing of the substrate W using a processing liquid L. Here, the substrate processing device 100 collectively performs processing of a plurality of substrates W. The substrate W is subjected to at least one of etching, surface treatment, impartment of properties, formation of a processed film, removing of at least a part of a film, and washing using the processing liquid L.

The substrate processing device 100 includes a processing tank 110, a substrate holding unit 120, a fluid supply unit 130, and a control unit 140. The processing tank 110 stores the processing liquid L for performing processing of the substrate W.

The substrate holding unit 120 holds the substrate W. A normal direction of a main surface of the substrate W held by the substrate holding unit 120 is parallel to a Y-direction. The substrate holding unit 120 moves the substrate W while holding the substrate W. For example, the substrate holding unit 120 moves vertically upward or vertically downward in the vertical direction while holding the substrate W.

Typically, the substrate holding unit 120 collectively holds a plurality of substrates W. Here, a plurality of substrates W are arranged in a row in the Y-direction. The substrate holding unit 120 may hold only one substrate W.

The fluid supply unit 130 supplies a fluid to the processing tank 110. In detail, the fluid supply unit 130 supplies a fluid to the processing tank 110 in which the processing liquid L is stored. When the fluid supply unit 130 supplies a fluid to the processing tank 110, processing of the substrate W is promoted.

The fluid supply unit 130 may supply a gas as a fluid to the processing tank 110. When the fluid supply unit 130 supplies a gas to the processing tank 110, air bubbles are formed in the processing liquid L. Air bubbles formed in the processing liquid L rise in the processing liquid L and reach the interface between the processing liquid L inside the processing tank 110 and a gas (for example, air or a predetermined atmosphere).

When air bubbles rise in the processing liquid L, the air bubbles come into contact with the front surface of the substrate W. In this case, the air bubbles move upward on the front surface of the substrate W while pushing out the part of a processing liquid in contact with the substrate W, and a fresh processing liquid L present therearound enters after the air bubbles pass through. In this manner, when air bubbles come into contact with the front surface of the substrate W, the front surface of the substrate W can be agitated. Accordingly, a processing liquid on the front surface of the substrate W can be replaced with a fresh processing liquid. As a result, the speed of processing the substrate W can be improved. When the substrate processing device 100 performs etching, it is preferable that the fluid supply unit 130 supply a gas as a fluid.

Alternatively, the fluid supply unit 130 may supply a liquid as a fluid to the processing tank 110. In this case, it is preferable that the fluid supply unit 130 supply a liquid to the processing liquid L inside the processing tank 110 upward from a position below. As an example, a fluid may be a processing liquid L of the same kind as the processing liquid L stored in the processing tank 110.

Even when the fluid supply unit 130 supplies the processing liquid L as a fluid, a processing liquid which has been supplied upward moves upward on the front surface of the substrate W while pushing out the part of the processing liquid in contact with the substrate W, and a fresh processing liquid L present therearound enters after the processing liquid which has been supplied upward passes through. In this manner, when a processing liquid which has been supplied upward comes into contact with the front surface of the substrate W, the front surface of the substrate W can be agitated. Accordingly, the processing liquid L on the front surface of the substrate W can be replaced with a fresh processing liquid. As a result, the speed of processing the substrate W can be improved.

The control unit 140 controls the fluid supply unit 130. Supply of a fluid performed by the fluid supply unit 130 is controlled in accordance with control of the control unit 140. In FIG. 1, supply of a fluid from the fluid supply unit 130 to the processing tank 110 performed in accordance with control of the control unit 140 is indicated with an arrow F.

The control unit 140 controls a start and a stop of supply of a fluid performed by the fluid supply unit 130. The control unit 140 may directly control the fluid supply unit 130 disposed inside the processing tank 110. Alternatively, the control unit 140 may control a fluid flowing in a piping which communicates with the fluid supply unit 130 disposed inside the processing tank 110. For example, the control unit 140 may control supply of a fluid performed by the fluid supply unit 130 by controlling a nozzle communicating with the fluid supply unit 130 disposed outside the processing tank 110, an adjustment valve, or the like.

In the substrate processing device 100 of the present embodiment, the control unit 140 controls the fluid supply unit 130 to start to supply a fluid to the processing tank 110 storing a processing liquid in which the substrate W is immersed. In addition, the control unit 140 controls the fluid supply unit 130 to end supply of a fluid to the processing tank 110 storing a processing liquid in which the substrate W is immersed. The control unit 140 controls the fluid supply unit 130 such that the fluid supply unit 130 changes supply of a fluid during a period from the start of supply of a fluid in the foregoing state to the end of supply of a fluid in the foregoing state. Accordingly, since supply of a fluid with respect to the substrate W is changed at the time of processing of the substrate W, a bias in processing with respect to the substrate W can be curbed.

Figure 2A:
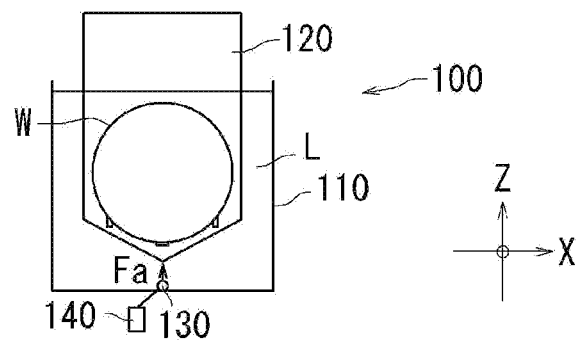
FIGS. 2A to 2C are schematic views for describing a substrate processing method of the present embodiment.
Figure 2B:
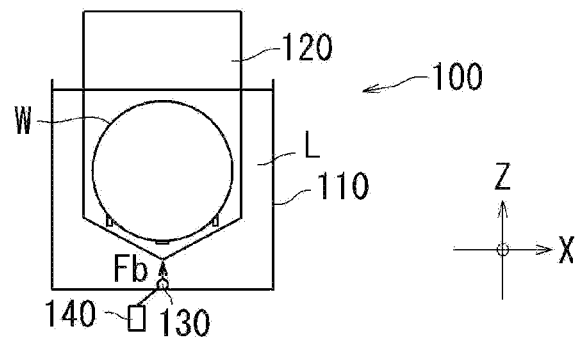
Figure 2C:
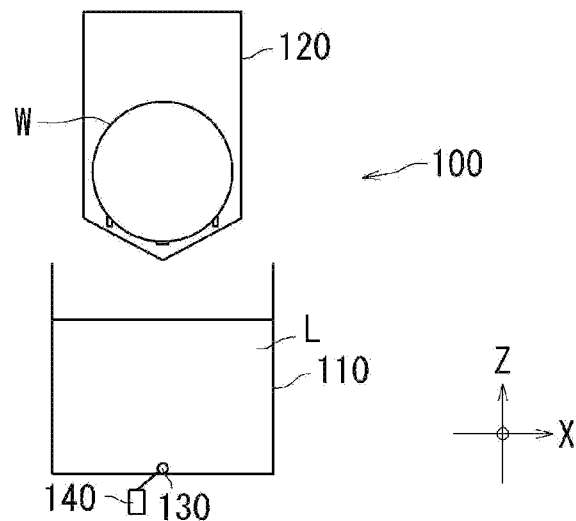

Next, with reference to FIGS. 2A to 2C, the substrate processing method of the present embodiment will be described. FIGS. 2A to 2C are schematic views for describing the substrate processing method of the present embodiment.

As illustrated in FIG. 2A, in the substrate processing device 100, the substrate W held by the substrate holding unit 120 is immersed in the processing liquid L in the processing tank 110. The fluid supply unit 130 supplies a fluid to the processing tank 110 in a state where the substrate W is immersed in the processing liquid L. Here, the fluid supply unit 130 supplies a fluid to the processing tank 110 under a first condition. In FIG. 2A, supply of a fluid supplied from the fluid supply unit 130 to the processing tank 110 is indicated with an arrow Fa.

The control unit 140 controls the substrate holding unit 120 such that the substrate holding unit 120 moves downward until the substrate W in its entirety is immersed in the processing liquid L inside the processing tank 110. In addition, the control unit 140 controls the fluid supply unit 130 such that the fluid supply unit 130 supplies a fluid to the processing tank 110 under the first condition.

As illustrated in FIG. 2B, while the substrate W held by the substrate holding unit 120 remains immersed in the processing liquid L in the processing tank 110, the fluid supply unit 130 changes supply of a fluid with respect to the substrate W. Here, the fluid supply unit 130 supplies a fluid to the processing tank 110 under a second condition. In FIG. 2B, supply of a fluid supplied from the fluid supply unit 130 to the processing tank 110 is indicated with an arrow Fb. The supply Fb of a fluid is different from the supply Fa of a fluid.

The control unit 140 controls the fluid supply unit 130 such that the fluid supply unit 130 supplies a fluid to the processing tank 110 under the second condition while the substrate W in its entirety is maintained in a state of being immersed in the processing liquid L inside the processing tank 110.

As illustrated in FIG. 2C, in the substrate processing device 100, the substrate holding unit 120 raises the held substrate W from the processing liquid L in the processing tank 110. The fluid supply unit 130 ends supply of a fluid before, at the same time as, or after the substrate W is raised from the processing liquid L in the processing tank 110. When the substrate W is raised from the processing liquid L in the processing tank 110 after ending supply of a fluid performed by the fluid supply unit 130, processing of the substrate W may continue even after supply of a fluid performed by the fluid supply unit 130 has ended.

The control unit 140 controls the substrate holding unit 120 such that the substrate holding unit 120 moves upward until the substrate W in its entirety is raised from the processing liquid L inside the processing tank 110. In addition, the control unit 140 controls the fluid supply unit 130 such that the fluid supply unit 130 ends supply of a fluid before, at the same time as, or after the substrate W is raised from the processing liquid L in the processing tank 110. In this manner, substrate processing ends.

As described above, supply of a fluid from the fluid supply unit 130 is changed such that the supply Fb of a fluid differs from the supply Fa of a fluid. In supply of a fluid from the fluid supply unit 130, the fluid supply unit 130 supplying a fluid may be at a different position. For example, when the fluid supply unit 130 is constituted of a plurality of members capable of individually supplying a fluid, a fluid may be supplied from a certain member of the fluid supply unit 130 under the first condition, and a fluid may be supplied from another member of the fluid supply unit 130 under the second condition.

Alternatively, the amount of outflow from the fluid supply unit 130 may be changed. For example, the amount of outflow of a fluid under the second condition may be different from the amount of outflow of a fluid under the first condition. As an example, the amount of outflow of a fluid under the second condition may be larger or smaller than the amount of outflow of a fluid under the first condition.

Alternatively, supply of a fluid from the fluid supply unit 130 may be changed by changing the kind of fluid to be supplied. For example, a main component of a fluid under the second condition may be different from a main component of a fluid under the first condition. Otherwise, the concentration of a fluid under the second condition may be different from the concentration of a fluid under the first condition. Alternatively, an additive of a fluid under the second condition may be different from an additive of a fluid under the first condition.

In addition, in the foregoing description referring to FIGS. 2A to 2C, supply of a fluid is changed from the first condition to the second condition. However, the present embodiment is not limited thereto. Supply of a fluid may be changed to three or more conditions different from one another.

According to the substrate processing method of the present embodiment, the control unit 140 controls the fluid supply unit 130 such that supply of a fluid is changed in a state where the substrate W is immersed in the processing liquid L inside the processing tank 110. Accordingly, since a fluid supplied to the substrate W varies, a bias with respect to processing of the substrate W can be curbed.

As described above, the fluid supply unit 130 may be constituted of a plurality of members capable of individually supplying a fluid. In this case, a fluid is supplied from a certain member of the fluid supply unit 130 under the first condition, and a fluid is supplied from another member of the fluid supply unit 130 under the second condition.

Figure 3:
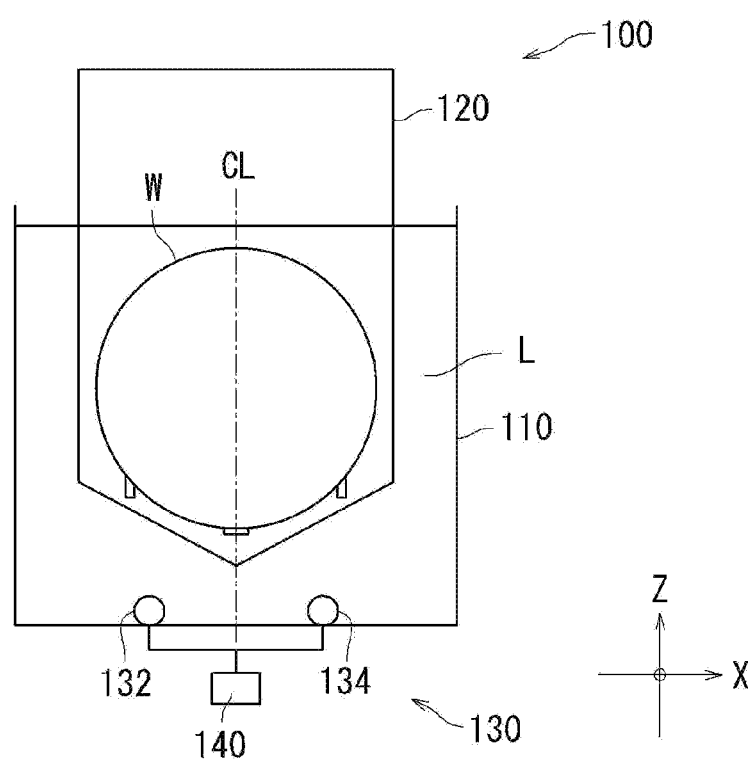
FIG. 3 is a schematic view of the substrate processing device of the present embodiment.

Next, with reference to FIG. 3, the substrate processing device 100 of the present embodiment will be described. FIG. 3 is a schematic view of the substrate processing device 100 of the present embodiment. The substrate processing device 100 illustrated in FIG. 3 is similar to the substrate processing device 100 described above with reference to FIGS. 1 and 2A to 2C except that the fluid supply unit 130 includes a first fluid supply unit 132 and a second fluid supply unit 134. Therefore, duplicate description will be omitted to avoid redundancy.

The substrate processing device 100 includes the processing tank 110, the substrate holding unit 120, the fluid supply unit 130, and the control unit 140. The fluid supply unit 130 includes the first fluid supply unit 132 and the second fluid supply unit 134.

The first fluid supply unit 132 supplies a fluid to the processing tank 110 in which the processing liquid L is stored. In addition, the second fluid supply unit 134 supplies a fluid to the processing tank 110 in which the processing liquid L is stored. The kind and the flow rate of a fluid of the first fluid supply unit 132 may be different from the kind and the flow rate of a fluid of the second fluid supply unit 134.

Here, the substrate W has a substantially circular thin plate shape. The substrate W has a central axis extending in the normal direction of the main surface through the center of the substrate W. The central axis of the substrate W is parallel to the Y-direction.

In FIG. 3, an imaginary centerline CL extending in the vertical direction through the center of the substrate W is indicated. The imaginary centerline CL extends in a Z-direction. The imaginary centerline CL is a vertical central axis of the substrate W. The imaginary centerline CL of the substrate W is orthogonal to the central axis of the substrate W.

The first fluid supply unit 132 and the second fluid supply unit 134 have tubular shapes. The first fluid supply unit 132 and the second fluid supply unit 134 extend in parallel (in the Y-direction) to the normal direction of the main surface of the substrate W. The first fluid supply unit 132 and the second fluid supply unit 134 are disposed in the bottom portion of the processing tank 110. The first fluid supply unit 132 and the second fluid supply unit 134 are positioned below the substrate W held by the substrate holding unit 120.

The first fluid supply unit 132 and the second fluid supply unit 134 are disposed in the bottom portion of the processing tank 110 with the imaginary centerline CL interposed therebetween. The first fluid supply unit 132 and the second fluid supply unit 134 are disposed in a substantially symmetrical manner with respect to the imaginary centerline CL in a plan view. The distance from the imaginary centerline CL to the first fluid supply unit 132 is substantially equivalent to the distance from the imaginary centerline CL to the second fluid supply unit 134.

Figure 4A:
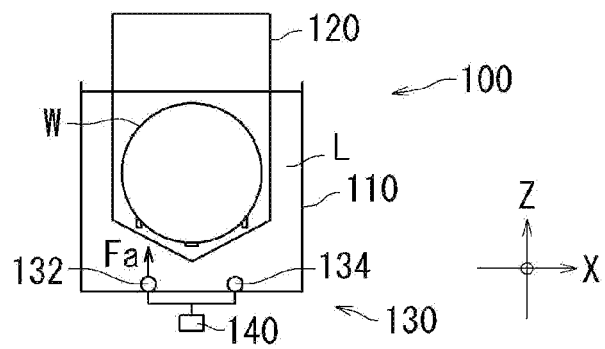
FIGS. 4A to 4C are schematic views for describing the substrate processing method of the present embodiment.
Figure 4B:
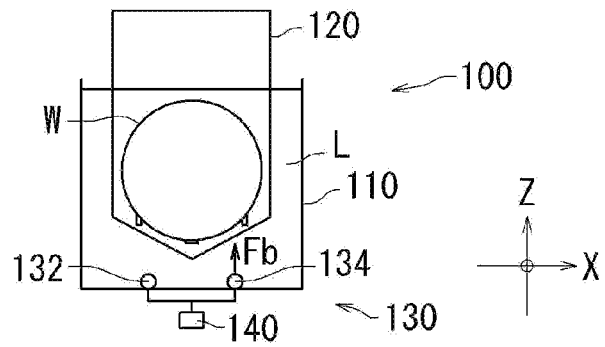
Figure 4C:
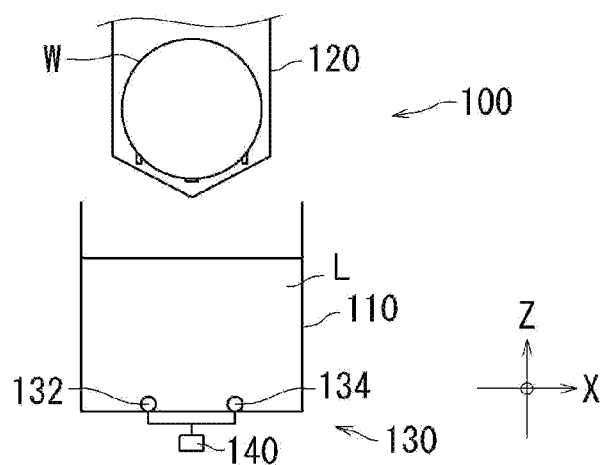

Next, with reference to FIGS. 4A to 4C, the substrate processing method of the present embodiment will be described. FIGS. 4A to 4C are schematic views for describing the substrate processing method performed by the substrate processing device 100 illustrated in FIG. 3.

As illustrated in FIG. 4A, in the substrate processing device 100, the substrate holding unit 120 causes the held substrate W to be immersed in the processing liquid L in the processing tank 110. The fluid supply unit 130 supplies a fluid to the processing tank 110 in a state where the substrate W is immersed in the processing liquid L. Here, the first fluid supply unit 132 supplies a fluid to the processing tank 110. In FIG. 4A, supply of a fluid from the first fluid supply unit 132 to the processing tank 110 is indicated with the arrow Fa.

The control unit 140 controls the substrate holding unit 120 such that the substrate holding unit 120 moves downward until the substrate W in its entirety is immersed in the processing liquid L inside the processing tank 110. In addition, the control unit 140 controls the fluid supply unit 130 such that the first fluid supply unit 132 supplies a fluid to the processing tank 110.

As illustrated in FIG. 4B, while the substrate W held by the substrate holding unit 120 remains immersed in the processing liquid L in the processing tank 110, the fluid supply unit 130 changes supply of a fluid with respect to the substrate W. Here, the second fluid supply unit 134 supplies a fluid to the processing tank 110. In FIG. 4B, supply of a fluid from the second fluid supply unit 134 to the processing tank 110 is indicated with the arrow Fb. The second fluid supply unit 134 is disposed at a position different from that of the first fluid supply unit 132. Therefore, the supply Fb of a fluid performed by the second fluid supply unit 134 is different from the supply Fa of a fluid performed by the first fluid supply unit 132.

The control unit 140 controls the fluid supply unit 130 such that the fluid supply unit 130 supplies a fluid to the processing tank 110 under the second condition while the substrate W in its entirety is maintained in a state of being immersed in the processing liquid L inside the processing tank 110.

As illustrated in FIG. 4C, in the substrate processing device 100, the substrate holding unit 120 raises the held substrate W from the processing liquid L in the processing tank 110. The second fluid supply unit 134 ends supply of a fluid before, at the same time as, or after the substrate W is raised from the processing liquid L in the processing tank 110.

The control unit 140 controls the substrate holding unit 120 such that the substrate holding unit 120 moves upward until the substrate W in its entirety is raised from the processing liquid L inside the processing tank 110. In addition, the control unit 140 controls the fluid supply unit 130 such that the fluid supply unit 130 ends supply of a fluid before, at the same time as, or after the substrate W is raised from the processing liquid L in the processing tank 110. In this manner, substrate processing ends.

In the substrate processing method illustrated in FIGS. 4A to 4C, one of the first fluid supply unit 132 and the second fluid supply unit 134 supplies a fluid to the processing tank 110. However, the present embodiment is not limited thereto. Both the first fluid supply unit 132 and the second fluid supply unit 134 may supply a fluid to the processing tank 110.

Next, with reference to FIGS. 5A to 5D, the substrate processing method of the present embodiment will be described. FIGS. 5A to 5D are schematic views for describing the substrate processing method of the present embodiment. The substrate processing method illustrated in FIGS. 5A to 5D is similar to the substrate processing method described above with reference to FIGS. 4A to 4C except that a step of supplying a fluid from the first fluid supply unit 132 and the second fluid supply unit 134 at the same time is included. Therefore, duplicate description will be omitted to avoid redundancy.

Figure 5A:
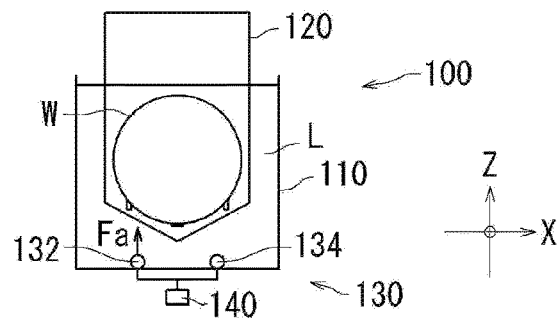
FIGS. 5A to 5D are schematic views for describing the substrate processing method of the present embodiment.

In FIG. 5A, as described above with reference to FIG. 4A, in the substrate processing device 100, the substrate holding unit 120 causes the held substrate W to be immersed in the processing liquid L in the processing tank 110. The first fluid supply unit 132 supplies a fluid to the processing tank 110 in a state where the substrate W is immersed in the processing liquid L. Here, a period during which the first fluid supply unit 132 supplies a fluid to the processing tank 110 and the second fluid supply unit 134 does not supply a fluid to the processing tank 110 will sometimes be referred to as a unilateral supply period.

Figure 5B:
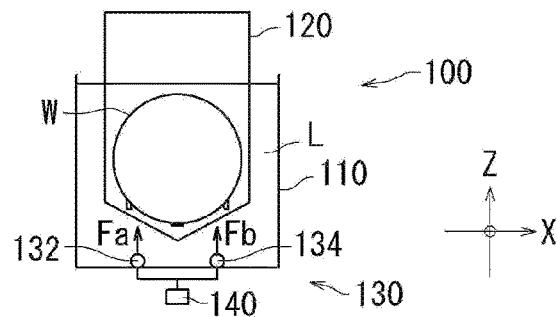
Figure 5C:
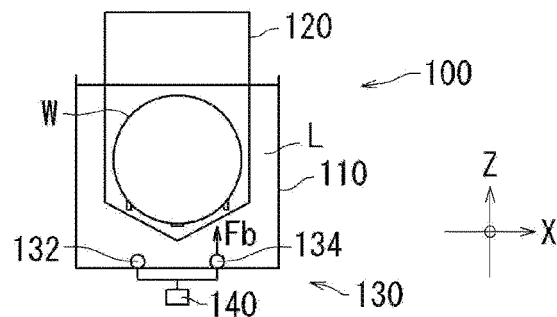

In FIG. 5C, as described above with reference to FIG. 4B, while the substrate W held by the substrate holding unit 120 remains immersed in the processing liquid L in the processing tank 110, the second fluid supply unit 134 supplies a fluid to the processing tank 110. Here, a period during which the second fluid supply unit 134 supplies a fluid to the processing tank 110 and the first fluid supply unit 132 does not supply a fluid to the processing tank 110 will sometimes be referred to as an alternative supply period.

In the present embodiment, as illustrated in FIG. 5B, the first fluid supply unit 132 and the second fluid supply unit 134 supply fluids to the processing tank 110 at the same time between the unilateral supply period (FIG. 5A) and the alternative supply period (FIG. 5C). Here, a period during which the first fluid supply unit 132 and the second fluid supply unit 134 each supply fluids to the processing tank 110 will sometimes be referred to as a bilateral supply period.

For example, in the bilateral supply period, the first fluid supply unit 132 may supply a fluid to the processing tank 110 under the same condition as the unilateral supply period. Similarly, the second fluid supply unit 134 may supply a fluid to the processing tank 110 under the same condition as the alternative supply period. However, in the bilateral supply period, when the first fluid supply unit 132 supplies a fluid under the same condition as the unilateral supply period and the second fluid supply unit 134 supplies a fluid under the same condition as the alternative supply period, if the bilateral supply period is relatively long, an excessive amount of a fluid will be supplied. Therefore, the processing liquid L may overflow from the processing tank 110. Therefore, in the bilateral supply period, when the first fluid supply unit 132 supplies a fluid under the same condition as the unilateral supply period and the second fluid supply unit 134 supplies a fluid under the same condition as the alternative supply period, it is preferable that the duration of the bilateral supply period be shorter than both the unilateral supply period and the alternative supply period.

Alternatively, in the bilateral supply period, the flow rate of a fluid supplied by the first fluid supply unit 132 may be lower than that of the unilateral supply period. Similarly, in the bilateral supply period, the flow rate of a fluid supplied by the second fluid supply unit 134 may be lower than that of the alternative supply period.

Figure 5D:
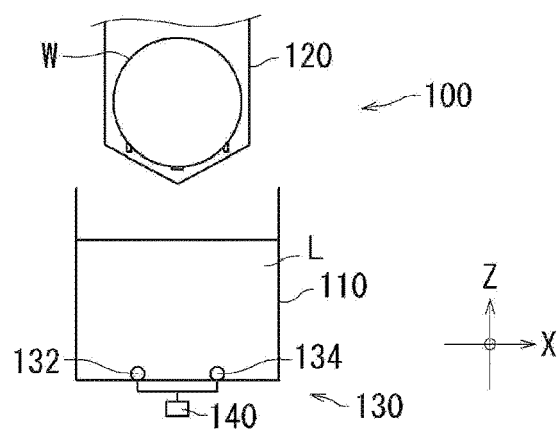

In FIG. 5D after the alternative supply period illustrated in FIG. 5C, as described above with reference to FIG. 2C, in the substrate processing device 100, the substrate holding unit 120 raises the held substrate W from the processing liquid L in the processing tank 110. The fluid supply unit 130 ends supply of a fluid before, at the same time as, or after the substrate W is raised from the processing liquid L in the processing tank 110.

In FIGS. 3 to 5D, the first fluid supply unit 132 supplies a fluid from a certain position inside the processing tank 110, and the second fluid supply unit 134 supplies a fluid from a different position inside the processing tank 110. However, the present embodiment is not limited thereto.

Figure 6A:
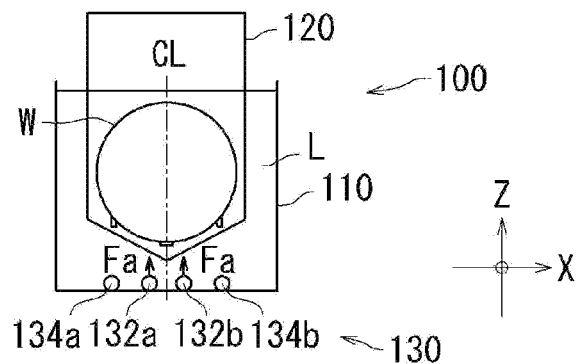
FIGS. 6A to 6C are schematic views for describing the substrate processing method of the present embodiment.
Figure 6B:
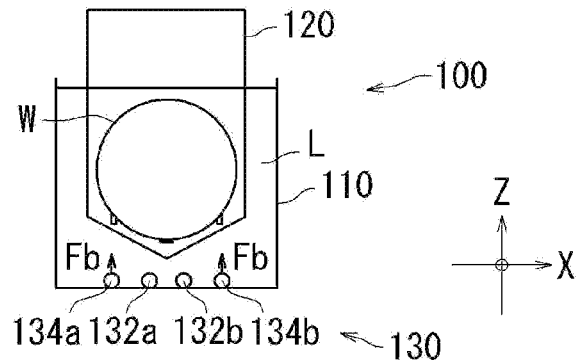
Figure 6C:
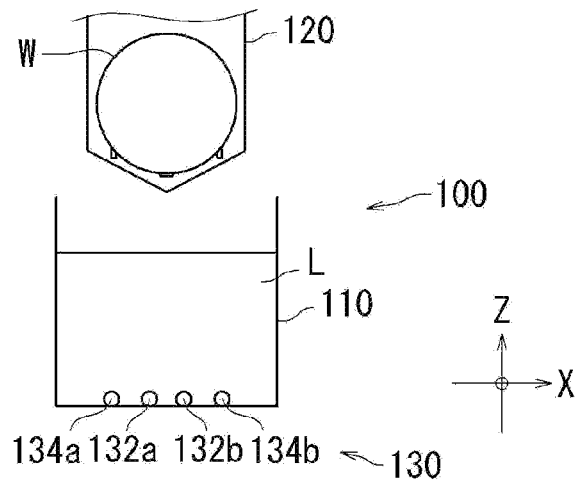

Next, with reference to FIGS. 6A to 6C, the substrate processing method of the present embodiment will be described. FIGS. 6A to 6C are schematic views for describing the substrate processing method of the present embodiment. The substrate processing method illustrated in FIGS. 6A to 6C is similar to the substrate processing method described above with reference to FIGS. 4A to 4C except that the first fluid supply unit 132 includes fluid supply tubes 132a and 132b and the second fluid supply unit 134 includes fluid supply tubes 134a and 134b in the substrate processing device 100. Therefore, duplicate description will be omitted to avoid redundancy.

As illustrated in FIG. 6A, in the substrate processing device 100, the fluid supply unit 130 includes the first fluid supply unit 132 and the second fluid supply unit 134. The first fluid supply unit 132 has the fluid supply tube 132a and the fluid supply tube 132b, and the second fluid supply unit 134 has the fluid supply tube 134a and the fluid supply tube 134b.

The fluid supply tubes 132a, 132b, 134a, and 134b are each disposed in the bottom portion of the processing tank 110. Here, the fluid supply tubes 132a, 132b, 134a, and 134b extend in parallel (in the Y-direction) to the normal direction of the main surface of the substrate W.

The fluid supply tubes 132a and 132b are disposed in a substantially symmetrical manner with respect to the imaginary centerline CL in a plan view. The distance from the imaginary centerline CL to the fluid supply tube 132a is substantially equivalent to the distance from the imaginary centerline CL to the fluid supply tube 132b. Similarly, the fluid supply tubes 134a and 134b are disposed in a substantially symmetrical manner with respect to the imaginary centerline CL in a plan view. The distance from the imaginary centerline CL to the fluid supply tube 134a is substantially equivalent to the distance from the imaginary centerline CL to the fluid supply tube 134b.

In the substrate processing device 100, the substrate holding unit 120 causes the held substrate W to be immersed in the processing liquid L in the processing tank 110. In a state where the substrate W is immersed in the processing liquid L, the first fluid supply unit 132 supplies fluids to the processing tank 110 from the fluid supply tube 132a and the fluid supply tube 132b of the first fluid supply unit 132. In FIG. 6A, supply of fluids from the fluid supply tube 132a and the fluid supply tube 132b to the processing tank 110 is indicated with the arrow Fa.

The control unit 140 controls the substrate holding unit 120 such that the substrate holding unit 120 moves downward until the substrate W in its entirety is immersed in the processing liquid L inside the processing tank 110. In addition, the control unit 140 controls the fluid supply unit 130 such that the first fluid supply unit 132 supplies fluids to the processing tank 110 from the fluid supply tube 132a and the fluid supply tube 132b.

As illustrated in FIG. 6B, while the substrate W held by the substrate holding unit 120 remains immersed in the processing liquid L in the processing tank 110, the fluid supply unit 130 changes supply of a fluid with respect to the substrate W. Here, the second fluid supply unit 134 supplies fluids to the processing tank 110 from the fluid supply tube 134a and the fluid supply tube 134b. In FIG. 6B, supply of a fluid from the second fluid supply unit 134 to the processing tank 110 is indicated with the arrow Fb. The fluid supply tube 134a and the fluid supply tube 134b are disposed at positions different from those of the fluid supply tube 132a and the fluid supply tube 132b. Therefore, the supply Fb of fluids from the fluid supply tube 134a and the fluid supply tube 134b is different from the supply Fa of fluids from the fluid supply tube 132a and the fluid supply tube 132b.

As illustrated in FIG. 6C, in the substrate processing device 100, the substrate holding unit 120 raises the held substrate W from the processing liquid L in the processing tank 110. The second fluid supply unit 134 ends supply of a fluid before, at the same time as, or after the substrate W is raised from the processing liquid L in the processing tank 110. In this manner, substrate processing ends.

In FIGS. 2A to 2C and 4A to 6C referred to in the foregoing description, regarding the fluid supply unit 130, in a state where the substrate W is immersed in the processing liquid L in the processing tank 110, the fluid supply unit 130 supplies a fluid to the processing tank 110. The timing when the fluid supply unit 130 starts to supply a fluid may be earlier than the timing when the substrate W starts to be immersed in the processing liquid L in the processing tank 110.

Next, with reference to FIGS. 7A to 7D, the substrate processing method of the present embodiment will be described. FIGS. 7A to 7D are schematic views for describing the substrate processing method of the present embodiment. The substrate processing method described with reference to FIGS. 7A to 7D is similar to the substrate processing method described above with reference to FIGS. 4A to 4C except that the substrate W is started to be immersed in the processing liquid L in the processing tank 110 after the fluid supply unit 130 starts to supply a fluid. Therefore, duplicate description will be omitted to avoid redundancy.

Figure 7A:
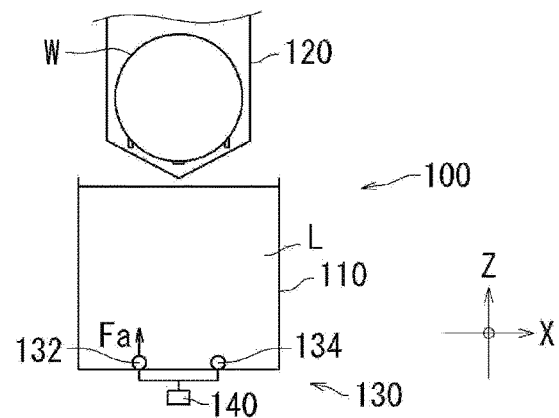
FIGS. 7A to 7D are schematic views for describing the substrate processing method of the present embodiment.

As illustrated in FIG. 7A, in the substrate processing device 100, the fluid supply unit 130 supplies a fluid to the processing tank 110 before the substrate W held by the substrate holding unit 120 is immersed in the processing liquid L in the processing tank 110. Here, the first fluid supply unit 132 supplies a fluid to the processing tank 110. The control unit 140 controls the fluid supply unit 130 such that the first fluid supply unit 132 supplies a fluid to the processing tank 110. In FIG. 7A, supply of a fluid from the first fluid supply unit 132 to the processing tank 110 is indicated with the arrow Fa.

Figure 7B:
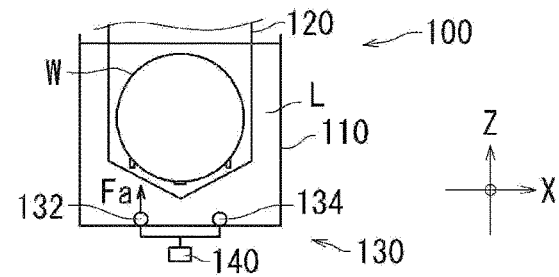

As illustrated in FIG. 7B, inside the processing tank 110 of the substrate processing device 100, the substrate W held by the substrate holding unit 120 is immersed in the processing liquid L to which the fluid supply unit 130 has started to supply a fluid. The control unit 140 controls the substrate holding unit 120 such that the substrate holding unit 120 moves downward until the substrate W in its entirety is immersed in the processing liquid L inside the processing tank 110.

Figure 7C:
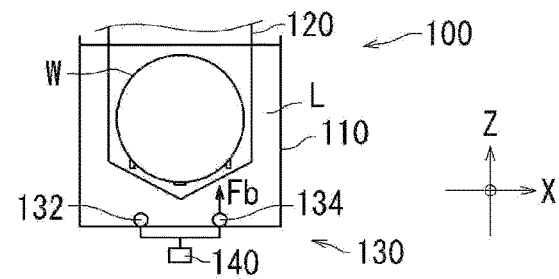

In FIG. 7C, as described above with reference to FIG. 4B, while the substrate W held by the substrate holding unit 120 remains immersed in the processing liquid L in the processing tank 110, the second fluid supply unit 134 supplies a fluid to the processing tank 110.

Figure 7D:
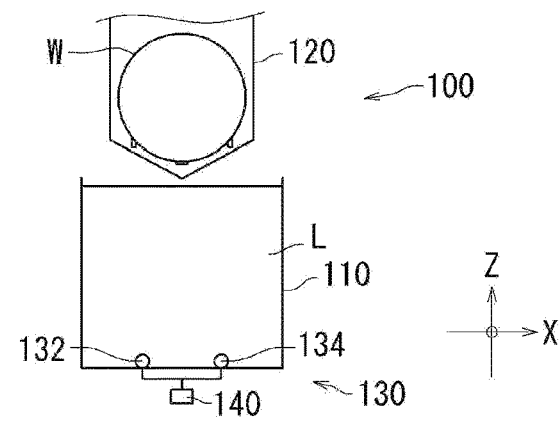

In FIG. 7D, as described above with reference to FIG. 4C, in the substrate processing device 100, the substrate W held by the substrate holding unit 120 is raised from the processing liquid L in the processing tank 110. The second fluid supply unit 134 ends supply of a fluid before, at the same time as, or after the substrate W is raised from the processing liquid L in the processing tank 110. In this manner, substrate processing ends.

In the substrate processing method referring to FIGS. 7A to 7D, the fluid supply unit 130 starts to supply a fluid before the substrate W is immersed in the processing liquid L. Therefore, processing of the substrate W using a fluid can be started at the timing when the substrate W is immersed in the processing liquid L, so that the processing time can be shortened.

In the foregoing description referring to FIGS. 7A to 7D, the timing when the fluid supply unit 130 starts to supply a fluid is earlier than the timing when the substrate W starts to be immersed in the processing liquid L in the processing tank 110. However, the present embodiment is not limited thereto. The timing when the substrate W starts to be immersed in the processing liquid L in the processing tank 110 may be earlier than the timing when the fluid supply unit 130 starts to supply a fluid.

Next, with reference to FIGS. 8A to 8D, the substrate processing method of the present embodiment will be described. FIGS. 8A to 8D are schematic views for describing the substrate processing method of the present embodiment. The substrate processing method described with reference to FIG. 8 is similar to the substrate processing method described above with reference to FIGS. 4A to 4C except that the fluid supply unit 130 starts to supply a fluid after the substrate W is immersed in the processing liquid L in the processing tank 110. Therefore, duplicate description will be omitted to avoid redundancy.

Figure 8A:
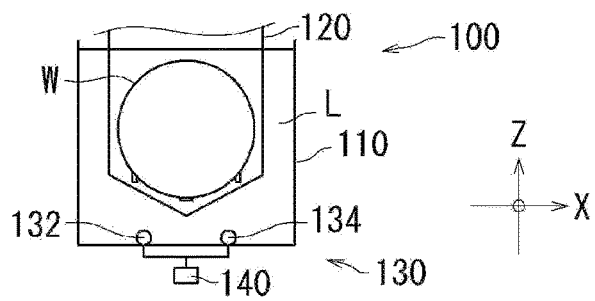
FIGS. 8A to 8D are schematic views for describing the substrate processing method of the present embodiment.

As illustrated in FIG. 8A, in the substrate processing device 100, the substrate W held by the substrate holding unit 120 is immersed in the processing liquid L in the processing tank 110. The control unit 140 controls the substrate holding unit 120 such that the substrate holding unit 120 moves downward until the substrate W in its entirety is immersed in the processing liquid L inside the processing tank 110.

Figure 8B:
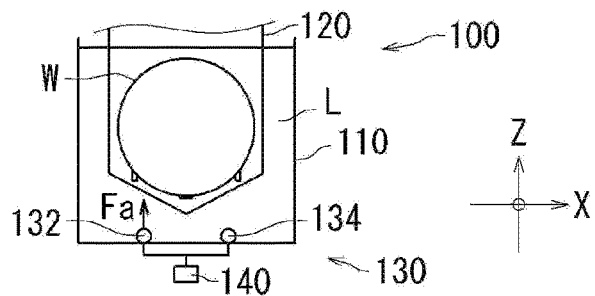

Thereafter, as illustrated in FIG. 8B, the fluid supply unit 130 supplies a fluid to the processing tank 110 in a state where the substrate W is immersed in the processing liquid L. Here, the first fluid supply unit 132 supplies a fluid to the processing tank 110. In FIG. 8B, supply of a fluid from the first fluid supply unit 132 to the processing tank 110 is indicated with the arrow Fa.

Figure 8C:
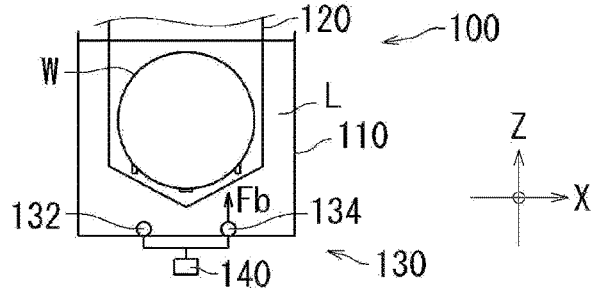

In FIG. 8C, as described above with reference to FIG. 4B, while the substrate W held by the substrate holding unit 120 remains immersed in the processing liquid L in the processing tank 110, the second fluid supply unit 134 supplies a fluid to the processing tank 110.

Figure 8D:
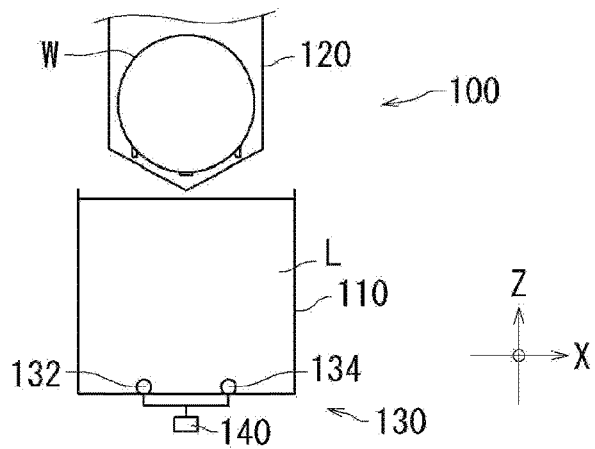

In FIG. 8D, as described above with reference to FIG. 4C, in the substrate processing device 100, the substrate W held by the substrate holding unit 120 is raised from the processing liquid L in the processing tank 110. The second fluid supply unit 134 ends supply of a fluid before, at the same time as, or after the substrate W is raised from the processing liquid L in the processing tank 110.

The control unit 140 controls the substrate holding unit 120 such that the substrate holding unit 120 moves upward until the substrate W in its entirety is raised from the processing liquid L inside the processing tank 110. In addition, the control unit 140 controls the fluid supply unit 130 such that the fluid supply unit 130 ends supply of a fluid before, at the same time as, or after the substrate W is raised from the processing liquid L in the processing tank 110. In this manner, substrate processing of the present embodiment ends.

In the present embodiment referring to FIGS. 8A to 8D, the fluid supply unit 130 starts to supply a fluid after the substrate W is immersed in the processing liquid L. Therefore, a fluid starts to be supplied after the substrate W ends its movement in the processing liquid L. Therefore, even when the processing liquid L inside the processing tank 110 oscillates in a relatively significant manner due to supply of a fluid, since the substrate W is at a standstill at the time of supply of the fluid, overflow of the processing liquid L from the processing tank 110 can be curbed.

In the description referring to FIGS. 7A to 7D and 8A to 8D, one of the timing when the substrate W starts to be immersed in the processing liquid L in the processing tank 110 and the timing when the fluid supply unit 130 starts to supply a fluid is earlier than the other. However, the present embodiment is not limited thereto. The timing when the substrate W starts to be immersed in the processing liquid L in the processing tank 110 and the timing when the fluid supply unit 130 starts to supply a fluid may be substantially the same as each other.

In the substrate processing device 100 illustrated in FIGS. 1 to 8D, the fluid supply unit 130 is disposed at the same position. However, the present embodiment is not limited thereto. The fluid supply unit 130 may move inside the processing tank 110.

Figure 9A:
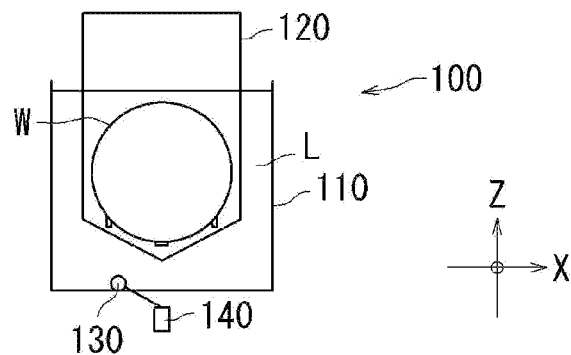
FIGS. 9A to 9C are schematic views for describing the substrate processing method of the present embodiment.
Figure 9B:
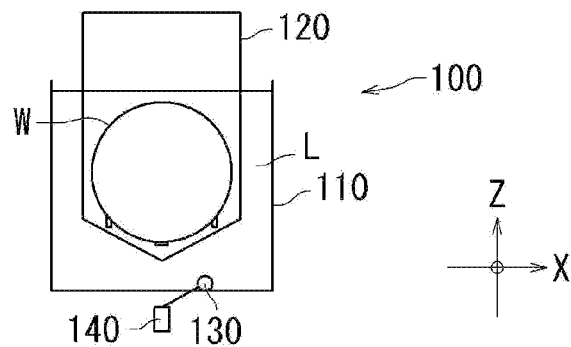
Figure 9C:
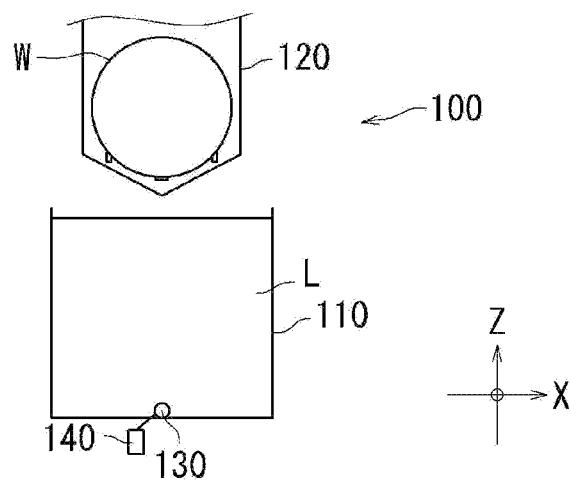

Next, with reference to FIGS. 9A to 9C, the substrate processing method of the present embodiment will be described. FIGS. 9A to 9C are schematic views for describing the substrate processing method of the present embodiment. The substrate processing method described with reference to FIGS. 9A to 9C is similar to the substrate processing method described above with reference to FIG. 1 except that the fluid supply unit 130 moves. Therefore, duplicate description will be omitted to avoid redundancy.

As illustrated in FIG. 9A, in the substrate processing device 100, the substrate holding unit 120 causes the held substrate W to be immersed in the processing liquid L in the processing tank 110. The fluid supply unit 130 supplies a fluid to the processing tank 110 in a state where the substrate W is immersed in the processing liquid L. Here, the fluid supply unit 130 is positioned at a first position inside the processing tank 110, and the fluid supply unit 130 supplies a fluid to the processing liquid L from the first position.

The control unit 140 can control the position of the fluid supply unit 130. For example, the fluid supply unit 130 moves in the bottom portion of the processing tank 110 in an X-direction and/or the Y-direction in accordance with control of the control unit 140. In addition, the control unit 140 controls the fluid supply unit 130 such that the fluid supply unit 130 supplies a fluid to the processing tank 110.

As illustrated in FIG. 9B, while the substrate W held by the substrate holding unit 120 remains immersed in the processing liquid L in the processing tank 110, the fluid supply unit 130 changes supply of a fluid with respect to the substrate W. Here, the fluid supply unit 130 moves from the first position to a second position while continuously supplying a fluid. Accordingly, since a fluid supplied from the fluid supply unit 130 at a different position comes into contact with the substrate W, the substrate W can be uniformly processed over a wide surface.

The control unit 140 controls the fluid supply unit 130 such that the fluid supply unit 130 moves inside the processing tank 110 and the fluid supply unit 130 supplies a fluid to the processing tank 110 while the substrate W in its entirety is maintained in a state of being immersed in the processing liquid L inside the processing tank 110. Here, the control unit 140 performs control such that the fluid supply unit 130 moves from a place below one end of the substrate W in the X-direction to a place below the other end of the substrate W in the X-direction. The control unit 140 may perform control such that the fluid supply unit 130 moves in a reciprocating manner between places below both of the end portions of the substrate W in the X-direction.

As illustrated in FIG. 9C, in the substrate processing device 100, the substrate holding unit 120 raises the held substrate W from the processing liquid L in the processing tank 110. The fluid supply unit 130 ends supply of a fluid before, at the same time as, or after the substrate W is raised from the processing liquid L in the processing tank 110. In this manner, substrate processing ends.

In the substrate processing method illustrated in FIGS. 9A to 9C, one fluid supply unit 130 moves. However, the present embodiment is not limited thereto. One fluid supply unit 130 may include a plurality of members individually supplying a fluid, and the plurality of members may move individually.

Figure 10:
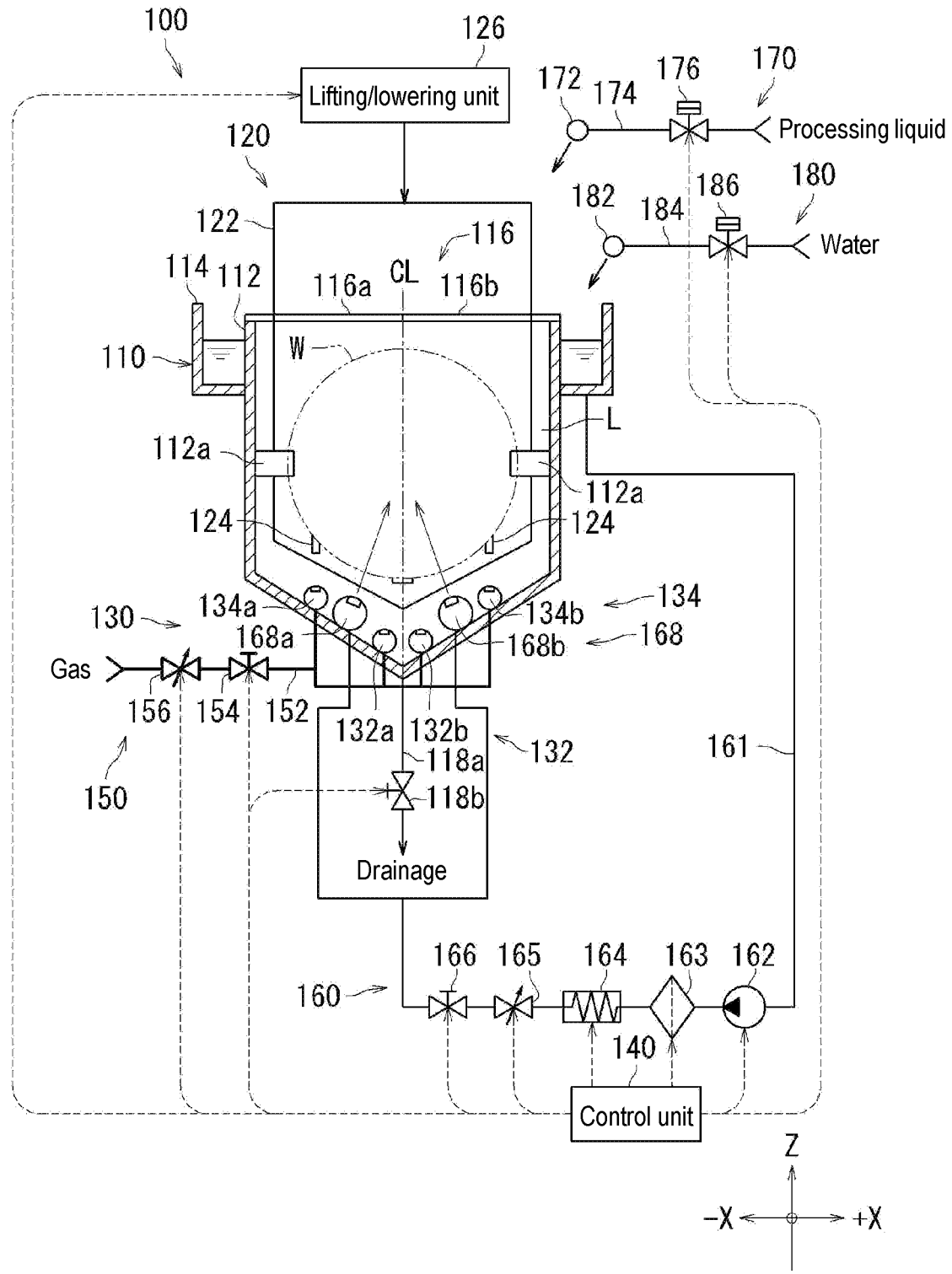
FIG. 10 is a schematic view of the substrate processing device of the present embodiment.

Next, with reference to FIG. 10, the substrate processing device 100 of the present embodiment will be described. FIG. 10 is a schematic view of the substrate processing device 100 of the present embodiment. The substrate processing device 100 of the present embodiment collectively performs processing of a plurality of substrates W. For example, the substrate processing device 100 collectively performs etching with respect to a plurality of substrates W.

The substrate processing device 100 of the present embodiment includes the processing tank 110, the substrate holding unit 120, the fluid supply unit 130, and the control unit 140. The processing tank 110 stores the processing liquid L. Examples of the processing liquid L include an etching liquid. The substrate holding unit 120 holds the substrate W. The substrate holding unit 120 includes a lifter. A plurality of substrates W can be collectively immersed in the processing liquid L stored in the processing tank 110 by the substrate holding unit 120. Here, the fluid supply unit 130 supplies a gas as a fluid to the processing tank 110 in which the processing liquid L is stored.

The substrate processing device 100 further includes a gas conveyance unit 150 and a circulation unit 160. The gas conveyance unit 150 conveys a gas to the fluid supply unit 130. The circulation unit 160 causes the processing liquid L stored in the processing tank 110 to circulate.

The substrate processing device 100 further includes a processing liquid supply unit 170 and a water supply unit 180. The processing liquid supply unit 170 supplies a processing liquid to the processing tank 110. The water supply unit 180 supplies water to the processing tank 110. The control unit 140 controls the substrate holding unit 120, the fluid supply unit 130, the circulation unit 160, the processing liquid supply unit 170, and the water supply unit 180.

The processing tank 110 has a double tank structure including an inner tank 112 and an outer tank 114. The inner tank 112 and the outer tank 114 each have an upper opening which opens upward. The inner tank 112 is constituted such that the processing liquid L can be stored and a plurality of substrates W can be accommodated. The outer tank 114 is provided on the outer surface of the upper opening of the inner tank 112. The height of an upper edge of the outer tank 114 is larger than the height of the upper edge of the inner tank 112.

Restriction portions 112a are provided in the inner tank 112. The restriction portions 112a are provided to face the main surfaces of one substrate W on both sides in both of the end portions of the substrate W in the X-direction when processing of the substrate W is performed. The position of the substrate W is restricted by the restriction portions 112a. Therefore, the substrate W is uniformly processed at a predetermined position.

The processing tank 110 further has a lid 116. The lid 116 can open and close the upper opening of the inner tank 112. When the lid 116 is closed, the lid 116 can block the upper opening of the inner tank 112.

The lid 116 has a door opening portion 116a and a door opening portion 116b. The door opening portion 116a is positioned on a side in the negative X-direction in the upper opening of the inner tank 112. The door opening portion 116a is disposed near the upper edge of the inner tank 112 and can open and close the upper opening of the inner tank 112. The door opening portion 116b is positioned on a side in the positive X-direction in the upper opening of the inner tank 112. The door opening portion 116b is disposed near the upper edge of the inner tank 112 and can open and close the upper opening of the inner tank 112. When the door opening portion 116a and the door opening portion 116b are closed and the upper opening of the inner tank 112 is covered, the inner tank 112 of the processing tank 110 can be blocked.

A drainage piping 118a is connected to a bottom wall of the inner tank 112. A valve 118b is disposed in the drainage piping 118a. The control unit 140 causes the valve 118b to be opened and closed. When the valve 118b is opened, a processing liquid stored inside the inner tank 112 is discharged to the outside through the drainage piping 118a. The discharged processing liquid is sent to a drainage processing apparatus (not illustrated) and is processed therein.

The substrate holding unit 120 holds the substrate W. The substrate holding unit 120 moves vertically upward or vertically downward in a state of holding the substrate W. When the substrate holding unit 120 moves vertically downward, the substrate W held by the substrate holding unit 120 is immersed in the processing liquid L stored in the inner tank 112.

The substrate holding unit 120 includes a main body plate 122 and holding rods 124. The main body plate 122 is a plate extending in the vertical direction (Z-direction). The holding rods 124 extend in the horizontal direction (Y-direction) from one main surface of the main body plate 122. Here, three holding rods 124 extend in the Y-direction from one main surface of the main body plate 122. A plurality of substrates W are held in an up-right posture (vertical posture) while the lower edges of the substrates W abut the plurality of holding rods 124 in a state where the plurality of substrates W are arranged in a direction toward the front and rear in the diagram.

The substrate holding unit 120 may further include a lifting/lowering unit 126. The lifting/lowering unit 126 lifts and lowers the main body plate 122 between a processing position (position illustrated in FIG. 10) at which the substrates W held by the substrate holding unit 120 are positioned inside the inner tank 112 and a retreat position (not illustrated) at which the substrates W held by the substrate holding unit 120 are positioned above the inner tank 112. Therefore, when the main body plate 122 is moved to the processing position by the lifting/lowering unit 126, the plurality of substrates W held by the holding rods 124 are immersed in a processing liquid. Accordingly, the substrates W are subjected to etching processing.

The fluid supply unit 130 is disposed in the processing tank 110. Here, the fluid supply unit 130 is disposed in the bottom portion of the inner tank 112 of the processing tank 110. The fluid supply unit 130 is disposed in the processing liquid L stored in the inner tank 112.

Here, the fluid supply unit 130 includes the first fluid supply unit 132 and the second fluid supply unit 134. The first fluid supply unit 132 includes the fluid supply tubes 132a and 132b, and the second fluid supply unit 134 includes the fluid supply tubes 134a and 134b. The fluid supply tubes 132a, 132b, 134a, and 134b supply gases as fluids to the processing tank 110. For example, the gases are inert gases. Examples of the gases include nitrogen gas. Alternatively, the gases may be air. The gases are supplied to the processing tank 110 from the fluid supply tubes 132a and 132b at the same time. In addition, the gases are supplied to the processing tank 110 from the fluid supply tubes 134a and 134b at the same time.

The gas conveyance unit 150 includes a piping 152, a valve 154, and an adjustment valve 156. The valve 154 and the adjustment valve 156 are disposed in the piping 152. The piping 152 is coupled to the fluid supply unit 130. The piping 152 guides a gas to the fluid supply unit 130 inside the processing tank 110. The valve 154 opens and closes the piping 152. The adjustment valve 156 regulates the opening degree of the piping 152 to adjust the flow rate of a gas to be conveyed to the fluid supply unit 130.

In FIG. 10, one valve 154 and one adjustment valve 156 are illustrated in order to avoid excessively complicated drawings. However, a plurality of valves 154 or a plurality of adjustment valves 156 may be provided. Accordingly, the amounts of gases supplied to the fluid supply tubes 132a, 132b, 134a, and 134b can be appropriately adjusted.

A liquid supply unit 168 is provided in the processing tank 110. The liquid supply unit 168 supplies a liquid to the inner tank 112 of the processing tank 110. Typically, the liquid supply unit 168 supplies a processing liquid of the same kind as the processing liquid L stored in the inner tank 112.

Here, the liquid supply unit 168 includes a plurality of liquid supply tubes 168a and 168b. The liquid supply tube 168a and the liquid supply tube 168b are disposed at different positions.

The circulation unit 160 includes a piping 161, a pump 162, a filter 163, a heater 164, an adjustment valve 165, and a valve 166. The pump 162, the filter 163, the heater 164, the adjustment valve 165, and the valve 166 are disposed toward the downstream side from the upstream side of the piping 161 in this order.

The piping 161 guides a processing liquid, which has been discharged from the processing tank 110, to the processing tank 110 again. The liquid supply tubes 168a and 168b are connected to the downstream end of the piping 161.

The pump 162 sends a processing liquid to the liquid supply tubes 168a and 168b through the piping 161. The filter 163 filters a processing liquid flowing in the piping 161. The heater 164 heats a processing liquid flowing in the piping 161. The temperature of a processing liquid is adjusted by the heater 164.

The adjustment valve 165 adjusts the flow rate of a processing liquid supplied to the liquid supply tubes 168a and 168b by regulating the opening degree of the piping 161. The adjustment valve 165 adjusts the flow rate of a processing liquid. The adjustment valve 165 includes a valve body (not illustrated) in which a valve seat is provided, a valve element which opens and closes the valve seat, and an actuator (not illustrated) which moves the valve element between an opened position and a closed position. A similar constitution also applies to other adjustment valves. The valve 166 opens and closes the piping 161.

The adjustment valve 165 may be omitted. In this case, the flow rate of a processing liquid supplied to the liquid supply tubes 168a and 168b is adjusted by controlling the pump 162.

The processing liquid supply unit 170 includes a nozzle 172, a piping 174, and a valve 176. The nozzle 172 ejects a processing liquid to the inner tank 112. The nozzle 172 is connected to the piping 174. A processing liquid from a processing liquid supply source is supplied to the piping 174. The valve 176 is disposed in the piping 174.

When the control unit 140 opens the valve 176, a processing liquid ejected from the nozzle 172 is supplied to the inside of the inner tank 112. Then, when a processing liquid overflows from the upper edge of the inner tank 112, the overflowing processing liquid is received and collected by the outer tank 114.

The water supply unit 180 includes a nozzle 182, a piping 184, and a valve 186. The nozzle 182 ejects water to the outer tank 114. The nozzle 182 is connected to the piping 184. As water to be supplied to the piping 184, any one of deionized water (DIW), carbonated water, electrolytic ion water, hydrogen water, ozonized water, and hydrochloric acid water at a dilute concentration (for example, within a range of approximately 10 ppm to 100 ppm) can be employed. Water from a water supply source is supplied to the piping 184. The valve 186 is disposed in the piping 184. When the control unit 140 opens the valve 186, water ejected from the nozzle 182 is supplied to the inside of the outer tank 114.

For example, the substrate processing device 100 performs etching processing of a silicon oxide film (oxide film) and a silicon nitride film (nitride film) with respect to the front surface on a side where a pattern is formed in the substrate W constituted of a silicon substrate. In such etching processing, an oxide film and a nitride film are selectively removed from the front surface of the substrate W. For example, when an aqueous solution of phosphoric acid ($H_3PO_4$) (which will hereinafter be referred to as "phosphoric acid") is used as a processing liquid to be supplied to the piping 174, a nitride film is removed from the front surface of the substrate W.

The fluid supply unit 130 generates air bubbles in the processing liquid L in the inner tank 112. A gas passes through the piping 152 from an inert gas supply source and is supplied to the processing liquid L in the inner tank 112 from the fluid supply unit 130.

The fluid supply unit 130 includes the first fluid supply unit 132 and the second fluid supply unit 134. The first fluid supply unit 132 includes the fluid supply tubes 132a and 132b, and the second fluid supply unit 134 includes the fluid supply tubes 134a and 134b. A number of air bubble ejection ports G are formed in the fluid supply tubes 132a, 132b, 134a, and 134b. The valve 154 and the adjustment valve 156 are disposed in the piping 152 of the gas conveyance unit 150. The valve 154 opens and closes the piping 152. The adjustment valve 156 adjusts the flow rate of an inert gas supplied to the fluid supply tubes 132a, 132b, 134a, and 134b by regulating the opening degree of the piping 152.

The fluid supply tube 132a is positioned between the liquid supply tube 168a and the imaginary centerline CL. Therefore, a fluid from the fluid supply tube 132a is supplied to a central portion of the substrate W, so that the substrate W can be efficiently processed over a wide area. Similarly, the fluid supply tube 132b is positioned between the liquid supply tube 168b and the imaginary centerline CL. Therefore, a fluid from the fluid supply tube 132b is supplied to a central portion of the substrate W, so that the substrate W can be efficiently processed over a wide area.

For example, the first fluid supply unit 132 supplies a fluid to the processing tank 110 from the fluid supply tube 132a and the fluid supply tube 132b of the first fluid supply unit 132 in a state where the substrate W is immersed in the processing tank 110. Thereafter, while the substrate W held by the substrate holding unit 120 remains immersed in the processing liquid L in the processing tank 110, supply of a fluid from the fluid supply tube 132a and the fluid supply tube 132b ends, and the second fluid supply unit 134 supplies a fluid to the processing tank 110 from the fluid supply tube 134a and the fluid supply tube 134b.

For example, the control unit 140 is constituted using a microcomputer. The control unit 140 has a computation unit such as a CPU, a storage unit such as a fixed memory device or a hard disk drive, and an input/output unit. A program executed by the computation unit is stored in the storage unit.

The control unit 140 controls operations of the lifting/lowering unit 126, the pump 162, the heater 164, and the like in accordance with a program set in advance. In addition, the control unit 140 controls opening/closing operations of the valve 118b, the valve 154, the valve 166, the valve 176, the valve 186, and the like. Moreover, the control unit 140 controls operations of adjusting the opening degrees of the adjustment valve 156, the adjustment valve 165, and the like.

Figure 11A:
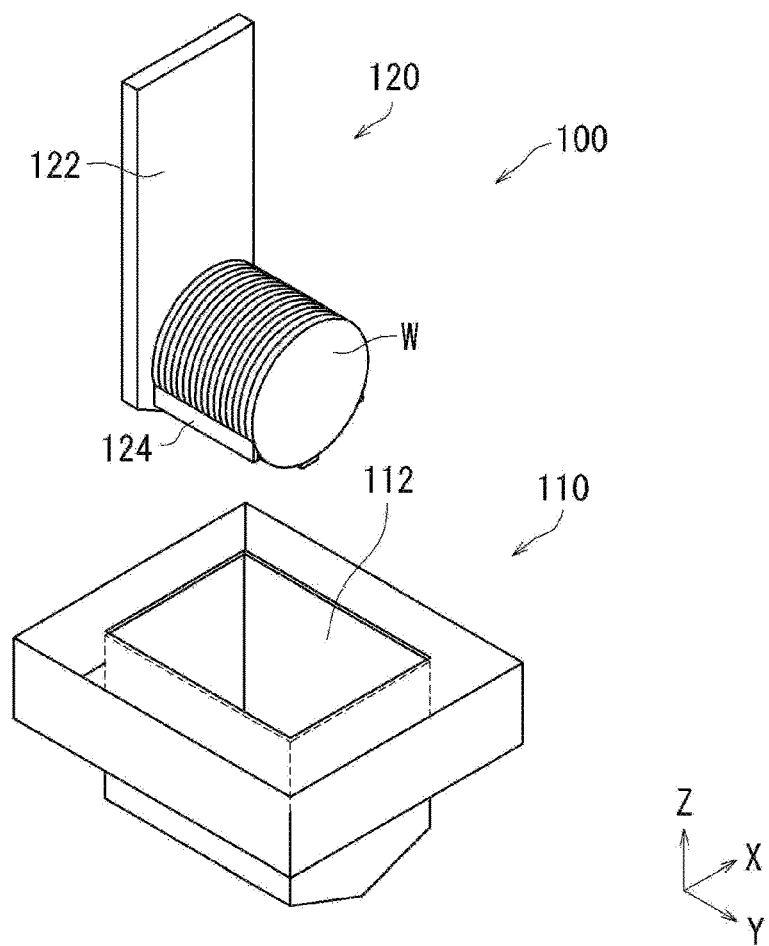
FIGS. 11A and 11B are schematic perspective views illustrating the substrate processing device of the present embodiment before and after a substrate is put in a processing tank.
Figure 11B:
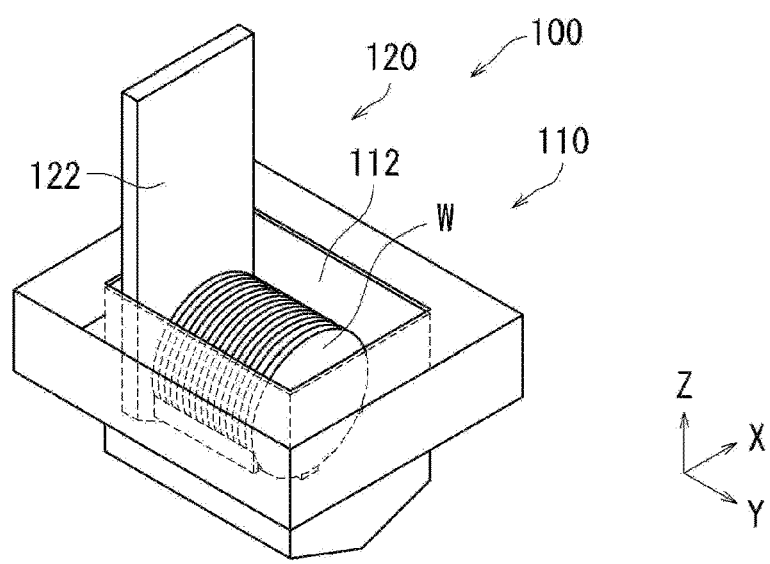

Next, with reference to FIGS. 11A and 11B, the substrate processing device 100 before and after the substrates W are immersed in the processing tank 110 will be described. FIGS. 11A and 11B are schematic perspective views of the substrate processing device 100 of the present embodiment before and after the substrates W are put in the processing tank 110. In FIGS. 11A and 11B, the lid 116 and the processing liquid L inside the processing tank 110 illustrated in FIG. 10 are omitted in order to avoid excessively complicated drawings.

As illustrated in FIG. 11A, the substrate holding unit 120 holds a plurality of substrates W. The plurality of substrates W are arranged in a row in the horizontal direction (Y-direction). For example, the substrate holding unit 120 holds 50 substrates W.

In FIG. 11A, the substrate holding unit 120 is positioned above the inner tank 112 of the processing tank 110. The length of the main body plate 122 in the X-direction is slightly smaller than the length of the inner tank 112 of the processing tank 110 in the X-direction. The substrate holding unit 120 vertically goes down (Z-direction) while holding the plurality of substrates W. Accordingly, the substrates W are put in the processing tank 110.

As illustrated in FIG. 11B, when the substrate holding unit 120 goes down to the processing tank 110, the substrates W are immersed in a processing liquid inside the processing tank 110. As illustrated in FIG. 10 (not illustrated in FIGS. 11A and 11B), the upper opening of the inner tank 112 is blocked by the lid 116.

Figure 12:
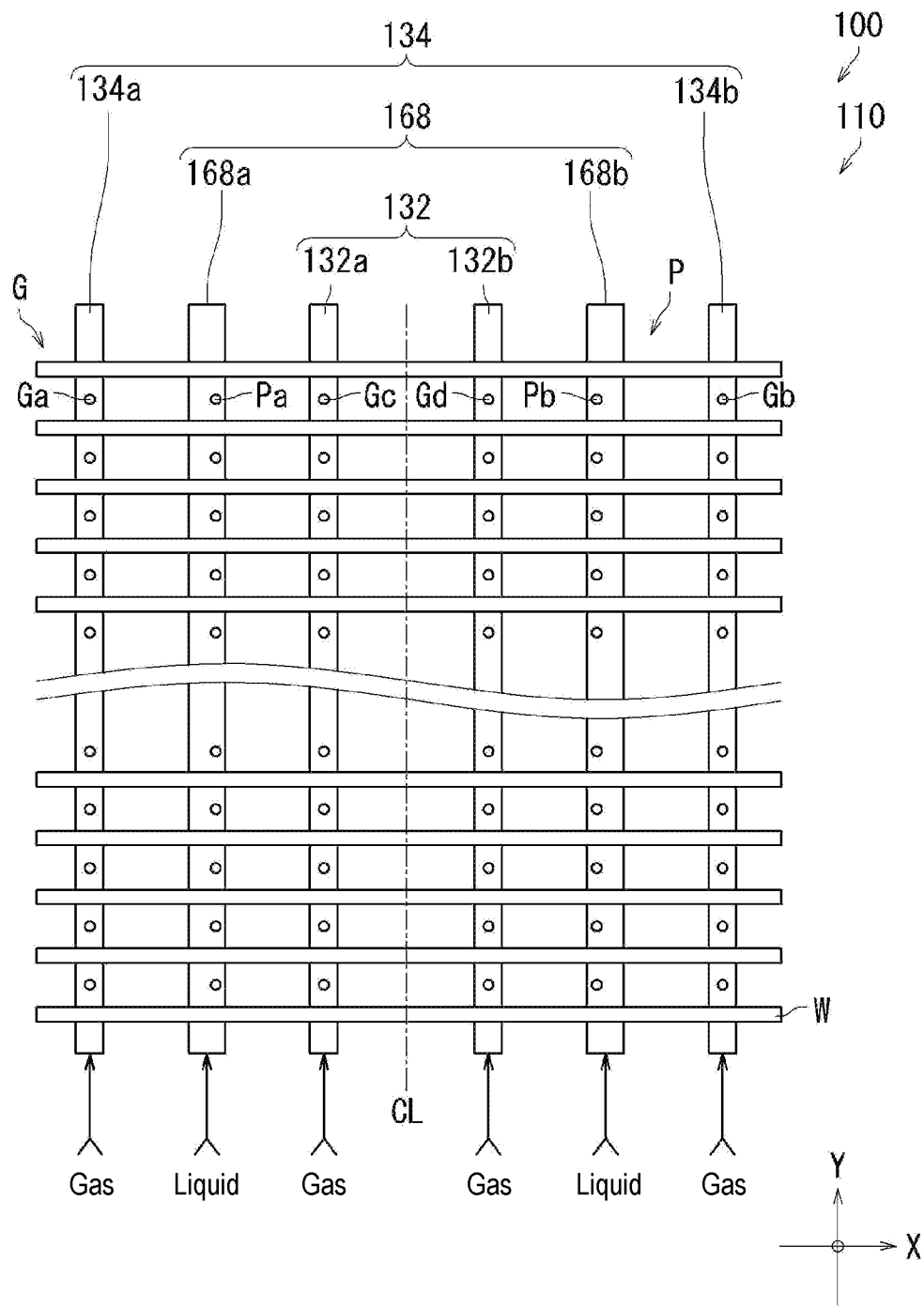
FIG. 12 is a schematic top view of a first fluid supply unit, a second fluid supply unit, and a liquid supply unit in the substrate processing device of the present embodiment.

Next, with reference to FIG. 12, constitutions of the first fluid supply unit 132, the second fluid supply unit 134, and the liquid supply unit 168 inside the processing tank 110 in the substrate processing device 100 illustrated in FIGS. 10, 11A, and 11B will be described. FIG. 12 is a schematic plan view illustrating the bottom portion of the inner tank 112 included in the substrate processing device 100 illustrated in FIG. 10. In FIG. 12, the imaginary centerline CL of the plurality of substrates W is illustrated in a continuous manner.

As illustrated in FIG. 12, the liquid supply unit 168 includes the liquid supply tube 168a and the liquid supply tube 168b. The liquid supply tube 168a and the liquid supply tube 168b are each disposed with the imaginary centerline CL interposed therebetween while passing through the center of the substrates W held by the substrate holding unit 120 (refer to FIG. 10) and extending in the Y-direction in a plan view. The liquid supply tube 168a and the liquid supply tube 168b each extend in the horizontal direction in an arrangement direction (Y-direction) of the substrates W in the bottom portion of the inner tank 112. The liquid supply tube 168a and the liquid supply tube 168b are formed using cylindrical tubes.

As illustrated in FIG. 12, a processing liquid ejection port P is provided in the liquid supply unit 168. A liquid in the liquid supply unit 168 is supplied to the inside of the processing tank 110 through the processing liquid ejection port P. The processing liquid ejection port P ejects the processing liquid L toward a place above the inner tank 112 in the bottom portion of the inner tank 112.

The processing liquid ejection port P includes an ejection port Pa provided in the liquid supply tube 168a, and an ejection port Pb provided in the liquid supply tube 168b. The ejection ports Pa and Pb are arranged in a row or in a plurality of rows (in a row in this embodiment) in the arrangement direction of the substrates W. The ejection ports Pa and Pb are disposed one by one between the substrates W in a plan view and are provided to supply processing liquids to places between the substrates W. The ejection port Pa and the ejection port Pb are each arranged at the same intervals as the intervals between the substrates W. The ejection ports Pa and Pb are each formed by boring holes in tube walls of the liquid supply tubes 168a and 168b. The ejection ports Pa and Pb are symmetrically provided with respect to the imaginary centerline CL. When the pump 162 is driven in a state where the control unit 140 has opened the valve 166 (FIG. 10), processing liquids are ejected through the ejection ports Pa and Pb at the flow rate of ejection adjusted by the adjustment valve 165.

Here, the first fluid supply unit 132 includes the fluid supply tubes 132a and 132b positioned at distant places. In addition, the second fluid supply unit 134 includes the fluid supply tubes 134a and 134b positioned at distant places.

In a plan view, the fluid supply tubes 132a and 132b are disposed between the liquid supply tube 168a and the liquid supply tube 168b. Therefore, the fluid supply tubes 132a and 132b are also referred to as inner pipings. On the other hand, in a plan view, the fluid supply tube 134a is disposed on a side opposite to the inner pipings with respect to the liquid supply tube 168a. Similarly, the fluid supply tube 134b is disposed on a side opposite to the inner pipings with respect to the liquid supply tube 168b. Therefore, the fluid supply tubes 134a and 134b are also referred to as outer pipings.

The fluid supply tubes 132a and 132b are each disposed with the imaginary centerline CL interposed therebetween in a plan view. The fluid supply tubes 132a and 132b are disposed in a substantially symmetrical manner with respect to the imaginary centerline CL in a plan view. The distance from the imaginary centerline CL to the fluid supply tube 132a is substantially equivalent to the distance from the imaginary centerline CL to the fluid supply tube 132b. Similarly, the fluid supply tubes 134a and 134b are disposed in a substantially symmetrical manner with respect to the imaginary centerline CL in a plan view. The distance from the imaginary centerline CL to the fluid supply tube 134a is substantially equivalent to the distance from the imaginary centerline CL to the fluid supply tube 134b.

The fluid supply tubes 132a, 132b, 134a, and 134b each extend in the horizontal direction in the arrangement direction (lateral direction in FIG. 12) of the substrates W in the bottom portion of the inner tank 112 (that is, below the substrates W held by the substrate holding unit 120). The fluid supply tubes 132a, 132b, 134a, and 134b are formed using cylindrical tubes (for example, using quartz).

As illustrated in FIG. 12, the air bubble ejection ports G are provided in the first fluid supply unit 132 and the second fluid supply unit 134. Gases of the first fluid supply unit 132 and the second fluid supply unit 134 are supplied to the inside of the processing liquid L in the processing tank 110 through the air bubble ejection ports G, so that air bubbles are formed in the processing liquid L. When the control unit 140 opens the valve 154, air bubbles are ejected through the air bubble ejection ports G at the flow rate of ejection adjusted by the adjustment valve 156.

The air bubble ejection ports G include an ejection port Ga provided in the fluid supply tube 134a, an ejection port Gb provided in the fluid supply tube 134b, an ejection port Gc provided in the fluid supply tube 132a, and an ejection port Gd provided in the fluid supply tube 132b. The ejection ports Ga to Gd are arranged in a row or in a plurality of rows (in a row in this embodiment) in the arrangement direction of the substrates W. The ejection ports Ga to Gd are disposed one by one between the substrates W in a plan view and are provided to supply air bubbles between the substrates W. The ejection ports Ga to Gd are each arranged at the same intervals as the intervals between the substrates W.

The ejection ports Ga to Gd are each formed by drilling holes in the tube walls of the fluid supply tubes 132a to 134b. The tube diameter of each of the fluid supply tubes 132a to 134b is approximately 8.0 mm, for example, and the diameter of each of the ejection ports Ga to Gd is approximately 0.3 mm, for example. When the fluid supply tubes 132a to 134b supply gases as fluids, air bubbles are generated through the ejection ports Ga to Gd of the fluid supply tubes 132a to 134b. The diameters (air bubble diameters) of air bubbles ejected through the ejection ports Ga to Gd are within a range of approximately 2.0 to approximately 3.5 mm. It is conceivable that the air bubbles having smaller diameters exhibit a greater agitation effect of air bubbles for a processing liquid near the front surface of the substrate W. Therefore, it is preferable that the air bubble diameter be small.

The ejection port Ga and the ejection port Gb are symmetrically provided with respect to the imaginary centerline CL. In addition, the ejection port Gc and the ejection port Gd are symmetrically provided with respect to the imaginary centerline CL.

When the substrate processing device 100 performs processing of the substrate W, after the substrate W is immersed in the processing tank 110 by the substrate holding unit 120 in a state where the lid 116 (FIG. 10) is opened, the substrate processing device 100 starts processing of the substrate W in a state where the lid 116 (FIG. 10) is closed, and the first fluid supply unit 132 and the second fluid supply unit 134 start to supply gases. Particularly, when the substrate processing device 100 supplies a gas to the substrate W, overflow of the processing liquid L from the processing tank 110 can be curbed by starting to supply gases in a state where the lid 116 is closed.

The substrate processing device 100 of the present embodiment supplies gases as fluids from the fluid supply tubes 132a and 132b of the first fluid supply unit 132 throughout a certain period. In addition, the substrate processing device 100 supplies gases as fluids from the fluid supply tubes 134a and 134b of the second fluid supply unit 134 throughout another period. The liquid supply unit 168 continues to supply liquids from the liquid supply tubes 168a and 168b during both periods.

Figure 13:
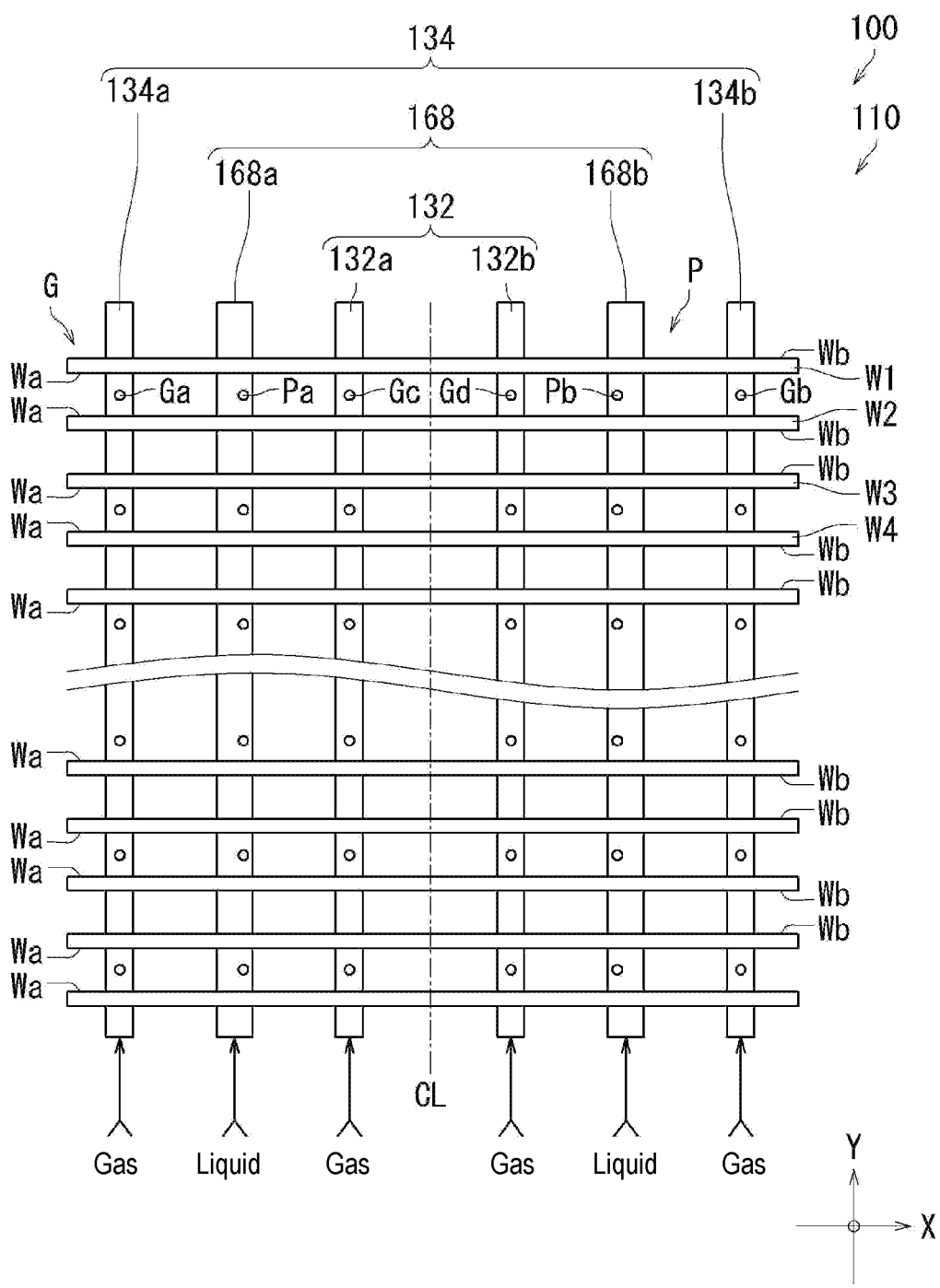
FIG. 13 is a schematic top view of the first fluid supply unit, the second fluid supply unit, and the liquid supply unit in the substrate processing device of the present embodiment.

Next, with reference to FIG. 13, the substrate processing device 100 of the present embodiment will be described. FIG. 13 is a schematic top view of the first fluid supply unit 132, the second fluid supply unit 134, and the liquid supply unit 168 in the substrate processing device 100 of the present embodiment. The substrate processing device 100 illustrated in FIG. 13 is similar to the substrate processing device 100 described above with reference to FIG. 12 except that the ejection ports Ga to Gd of the fluid supply tubes 132a to 134b and the ejection ports Pa and Pb of the liquid supply tubes 168a and 168b are each provided in every other substrate of a plurality of substrates W arranged in a row. Therefore, duplicate description will be omitted to avoid redundancy.

In FIG. 13, a plurality of substrates W of the same kind are arranged in a row in the Y-direction. Adjacent substrates W face each other such that the same surfaces face each other.

The substrate W has main surfaces Wa and Wb. The main surface Wa is the front surface of the substrate, and the main surface Wb is the rear surface of the substrate W. Here, the main surfaces Wa of facing adjacent substrates W face each other, and the main surfaces Wb of facing adjacent substrates W face each other.

As illustrated in FIG. 13, the air bubble ejection ports G include the ejection port Ga provided in the fluid supply tube 134a, the ejection port Gb provided in the fluid supply tube 134b, the ejection port Gc provided in the fluid supply tube 132a, and the ejection port Gd provided in the fluid supply tube 132b. The ejection ports Ga to Gd are arranged in a row or in a plurality of rows (in a row in this embodiment) in the X-direction. In addition, the ejection ports Ga to Gd and the ejection ports Pa and Pb are each arranged in every other substrate in the arrangement direction (Y-direction) of the substrates W.

The ejection ports Ga, Gb, Gc, and Gd are disposed one by one between two substrates W of which the main surfaces Wa face each other in a plan view and are provided to supply processing liquids between the substrates W. On the other hand, the ejection ports Ga, Gb, Gc, and Gd are not provided between two substrates W of which the main surfaces Wb face each other in a plan view. For example, the ejection ports Ga, Gb, Gc, and Gd are disposed one by one between a substrate W1 and a substrate W2 of which the main surfaces Wa face each other in a plan view and are provided to supply processing liquids between the substrates W. On the other hand, the ejection ports Ga, Gb, Gc, and Gd are not provided between the substrate W2 and a substrate W3 of which the main surfaces Wb face each other in a plan view.

Similarly, the processing liquid ejection port P includes the ejection port Pa provided in the liquid supply tube 168a, and the ejection port Pb provided in the liquid supply tube 168b. The ejection ports Pa and Pb are each arranged in every other substrate in the arrangement direction (Y-direction) of the substrates W.

The ejection ports Pa and Pb are disposed one by one between two substrates W of which the main surfaces Wa face each other in a plan view and are provided to supply processing liquids between the substrates W. On the other hand, the ejection ports Pa and Pb are not provided between two substrates W of which the main surfaces Wb face each other in a plan view. For example, the ejection ports Pa and Pb are disposed one by one between the substrate W1 and the substrate W2 of which the main surfaces Wa face each other in a plan view and are provided to supply processing liquids between the substrates W. On the other hand, the ejection ports Pa and Pb are not provided between the substrate W2 and the substrate W3 of which the main surfaces Wb face each other in a plan view.

In the substrate processing device 100 illustrated in FIG. 13, the ejection ports Pa and Pb and the ejection ports Ga, Gb, Gc, and Gd are disposed between two substrates W of which the main surfaces Wa face each other and are not disposed between two substrates W of which the main surfaces Wb face each other. For example, when the flow rates of fluids flowing in the fluid supply tubes 132a, 132b, 134a, and 134b are constant, due to a small number of ejection ports Ga, Gb, Gc, and Gd, the amounts of fluids ejected through the ejection ports Ga, Gb, Gc, and Gd can be increased. Similarly, when the flow rates of fluids flowing in the liquid supply tubes 168a and 168b are constant, due to a small number of ejection ports Pa and Pb, the amounts of fluids ejected through the ejection ports Pa and Pb can be increased. Therefore, a particular surface of the substrate W can be efficiently processed.

Figure 14:
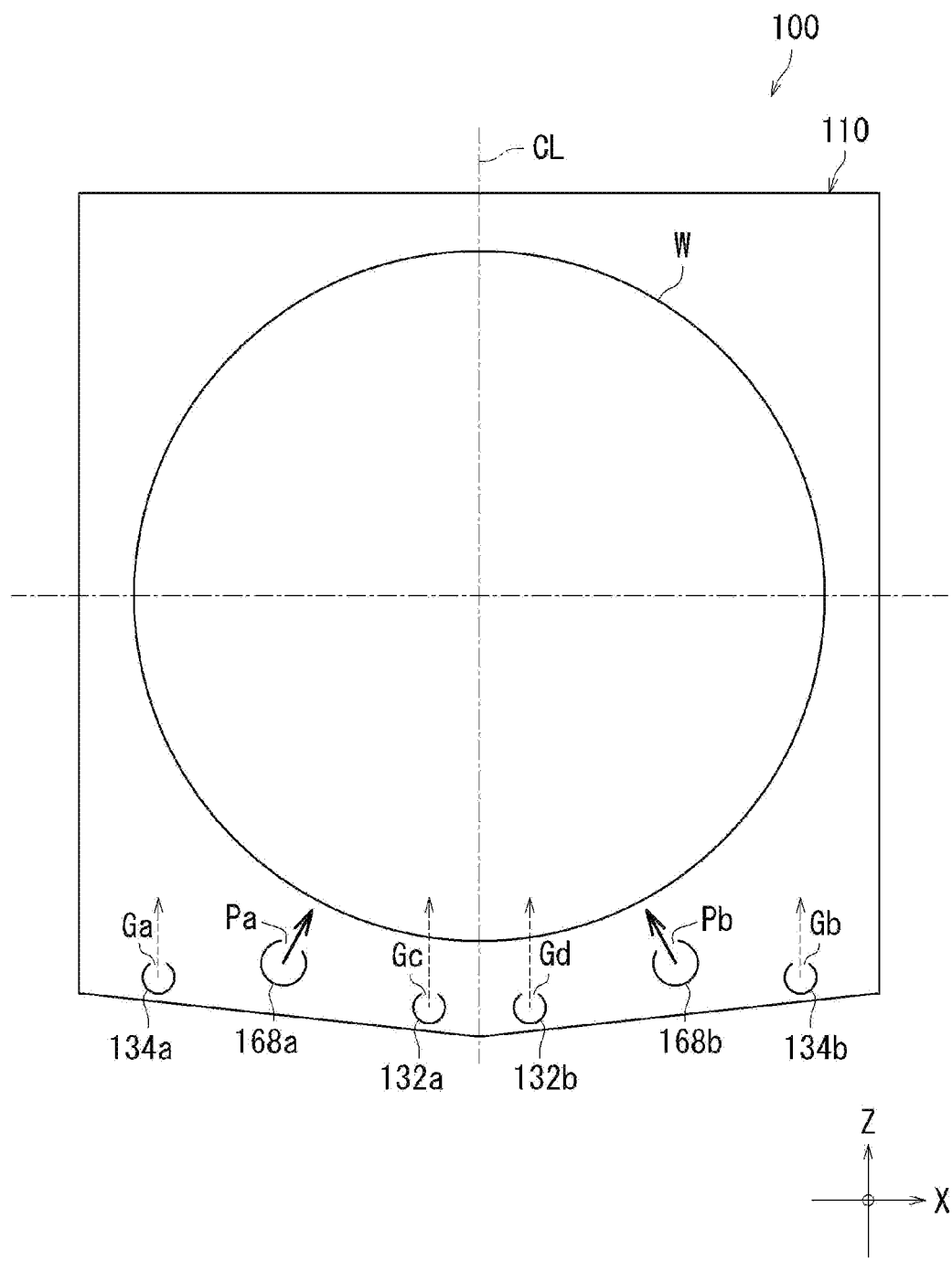
FIG. 14 is a schematic side view of the substrate processing device of the present embodiment.

Next, with reference to FIG. 14, the substrate processing device 100 of the present embodiment will be described. FIG. 14 is a schematic side view of the processing tank 110 in the substrate processing device 100 of the present embodiment.

The fluid supply tubes 132a, 132b, 134a, and 134b and the liquid supply tubes 168a and 168b are disposed in the processing tank 110. The ejection ports Ga, Gb, Gc, and Gd of the fluid supply tubes 134a, 134b, 132a, and 132b are provided in the upper portions of the fluid supply tubes 134a, 134b, 132a, and 132b such that their ejection directions extend in the vertical direction.

On the other hand, the ejection ports Pa and Pb of the liquid supply tubes 168a and 168b are provided at positions inclined with respect to the vertical direction (Z-direction) such that their ejection directions are directed toward the center of the substrate W. Therefore, when a liquid flow ejected obliquely upward through the ejection port Pa of the liquid supply tube 168a and a liquid flow ejected obliquely upward through the ejection port Pb of the liquid supply tube 168b join together, an extremely strong up-flow flowing upward inside the processing tank 110 can be formed.

As described above, in the substrate processing device 100, a gas is supplied as a fluid from the fluid supply tubes 132a and 132b of the first fluid supply unit 132 throughout a certain period. In addition, a gas is supplied as a fluid from the fluid supply tubes 134a and 134b of the second fluid supply unit 134 throughout another period.

Figure 15A:
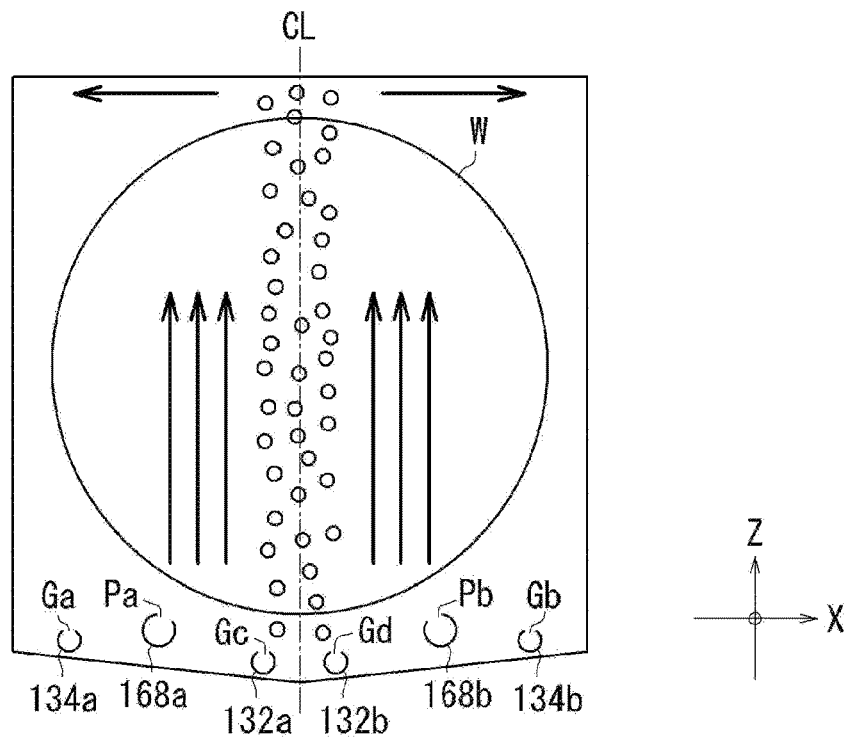
FIGS. 15A and 15B are schematic views for describing the substrate processing method of the present embodiment.
Figure 15B:
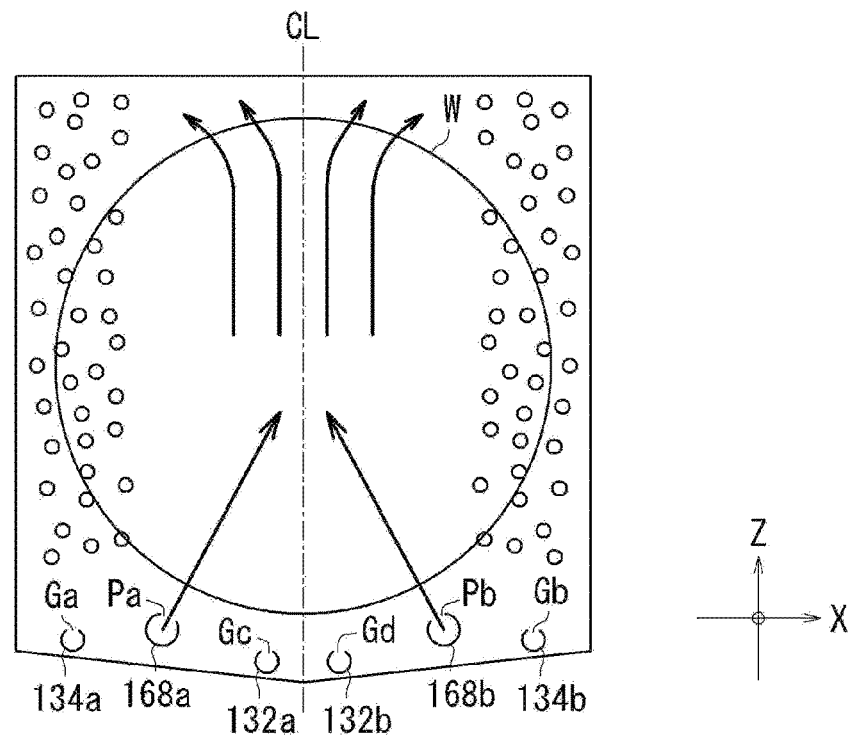

Next, with reference to FIGS. 15A and 15B, the substrate-processing method of the present embodiment will be described. FIGS. 15A and 15B are schematic views for describing the substrate processing method of the present embodiment.

As illustrated in FIG. 15A, during a certain period, no gas is ejected through the ejection port Ga of the fluid supply tube 134a and the ejection port Gb of the fluid supply tube 134b, and gases are ejected through the ejection port Gc of the fluid supply tube 132a and the ejection port Gd of the fluid supply tube 132b. In addition, liquids are ejected through the ejection port Pa of the liquid supply tube 168a and the ejection port Pb of the liquid supply tube 168b.

In this case, air bubbles ejected through the ejection port Gc of the fluid supply tube 132a and the ejection port Gd of the fluid supply tube 132b rise upward in a substantially vertical manner. Therefore, air bubbles come into contact with a surrounding region of the imaginary centerline CL on the front surface of the substrate W.

The liquids ejected through the ejection port Pa of the liquid supply tube 168a and the ejection port Pb of the liquid supply tube 168b cannot come near the center of the substrate W due to the air bubbles. Therefore, relatively strong up-flows directed upward through the ejection port Pa and the ejection port Pb are formed.

Here, since no gas is ejected through the ejection port Ga of the fluid supply tube 134a and the ejection port Gb of the fluid supply tube 134b, relatively weak down-flows are formed above the ejection port Ga and the ejection port Gb.

As illustrated in FIG. 15B, during another period, gases are ejected through the ejection port Ga of the fluid supply tube 134a and the ejection port Gb of the fluid supply tube 134b, and no gas is ejected through the ejection port Gc of the fluid supply tube 132a and the ejection port Gd of the fluid supply tube 132b. In addition, liquids are continuously ejected through the ejection port Pa of the liquid supply tube 168a and the ejection port Pb of the liquid supply tube 168b.

Here, no gas is ejected through the ejection port Gc of the fluid supply tube 132a and the ejection port Gd of the fluid supply tube 132b. Therefore, a liquid flow ejected obliquely upward through the ejection port Pa of the liquid supply tube 168a and a liquid flow ejected obliquely upward through the ejection port Pb of the liquid supply tube 168b join together, and an extremely strong up-flow flowing upward inside the processing tank 110 is formed.

In addition, air bubbles ejected through the ejection port Ga of the fluid supply tube 134a and the ejection port Gb of the fluid supply tube 134b rise upward in a substantially vertical manner. Therefore, air bubbles ejected through the ejection port Ga of the fluid supply tube 134a move upward and are supplied to a region in one end portion of the substrate W in the traverse direction. Similarly, air bubbles ejected through the ejection port Gb of the fluid supply tube 134b move upward and are supplied to a region in the other end portion of the substrate W in the traverse direction.

As it is understood from the comparison between FIGS. 15A and 15B, flows of a processing liquid and air bubbles with respect to the substrate W can be switched by switching between supply of a fluid performed by the first fluid supply unit 132 and supply of a fluid performed by the second fluid supply unit 134. Therefore, a bias in processing with respect to the substrate W can be curbed.

In the substrate processing device 100 illustrated in FIGS. 10, 12 to 14, the fluid supply tube 132a and the fluid supply tube 134a are disposed to face each other with the liquid supply tube 168a interposed therebetween, and the fluid supply tube 132b and the fluid supply tube 134b are disposed to face each other with the liquid supply tube 168b interposed therebetween. However, the present embodiment is not limited thereto.

Figure 16:
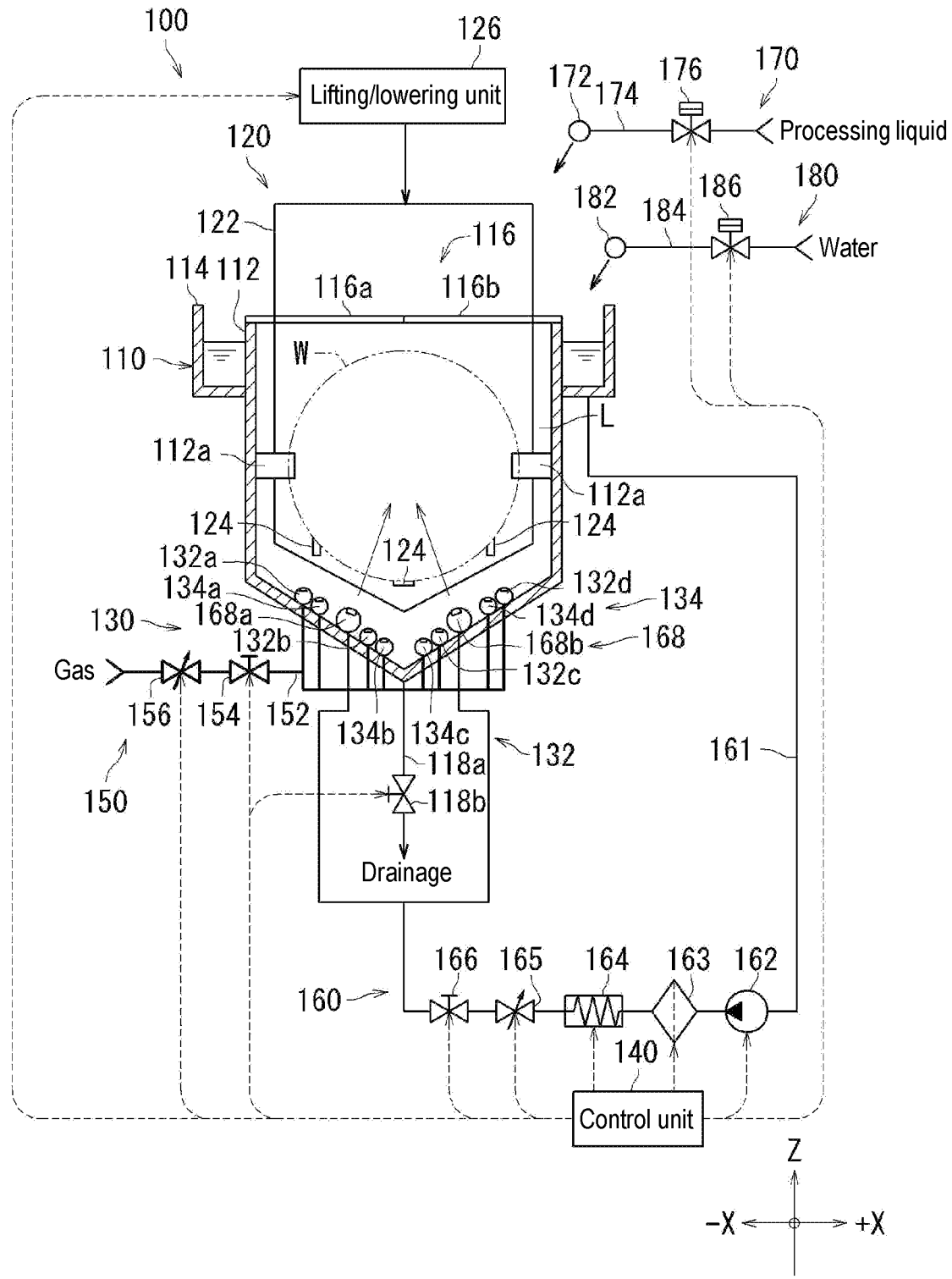
FIG. 16 is a schematic view of the substrate processing device of the present embodiment.

Next, with reference to FIG. 16, the substrate processing device 100 of the present embodiment will be described. FIG. 16 is a schematic view of the substrate processing device 100 of the present embodiment. The substrate processing device 100 illustrated in FIG. 16 is similar to the substrate processing device 100 described above with reference to FIG. 10 except that the fluid supply tubes of both the first fluid supply unit 132 and the second fluid supply unit 134 are disposed respectively on both sides of the liquid supply tube 168a, and the fluid supply tubes of both the first fluid supply unit 132 and the second fluid supply unit 134 are disposed respectively on both sides of the liquid supply tube 168b. Therefore, duplicate description will be omitted to avoid redundancy.

The substrate processing device 100 includes the processing tank 110, the substrate holding unit 120, the fluid supply unit 130, and the control unit 140. The fluid supply unit 130 includes the first fluid supply unit 132 and the second fluid supply unit 134. The first fluid supply unit 132 includes the fluid supply tubes 132a, 132b, 132c, and 132d. In this specification, the fluid supply tubes 132a, 132b, 132c, and 132d of the first fluid supply unit 132 will sometimes be referred to as a first fluid supply tube 132a, a second fluid supply tube 132b, a third fluid supply tube 132c, and a fourth fluid supply tube 132d, respectively.

The fluid supply tubes 132a, 132b, 132c, and 132d extend in the Y-direction. The second fluid supply unit 134 includes the fluid supply tubes 134a, 134b, 134c, and 134d. The fluid supply tubes 134a, 134b, 134c, and 134d extend in the Y-direction. In this specification, the fluid supply tubes 134a, 134b, 134c, and 134d of the second fluid supply unit 134 will sometimes be referred to as a fifth fluid supply tube 134a, a sixth fluid supply tube 134b, a seventh fluid supply tube 134c, and an eighth fluid supply tube 134d, respectively.

Focusing on the fluid supply tube 132a to the fluid supply tube 134d disposed in the inner tank 112 of the processing tank 110, the fluid supply tube 132a, the fluid supply tube 134a, the fluid supply tube 132b, the fluid supply tube 134b, the fluid supply tube 134c, the fluid supply tube 132c, the fluid supply tube 134d, and the fluid supply tube 132d are disposed in this order from the side in the negative X-direction toward the side in the positive X-direction. Therefore, the fluid supply tube 132a and the fluid supply tube 134a are disposed on the side in the negative X-direction with respect to the liquid supply tube 168a, and the fluid supply tube 132b and the fluid supply tube 134b are disposed on the side in the positive X-direction with respect to the liquid supply tube 168a.

In addition, the fluid supply tube 132c and the fluid supply tube 134c are disposed on the side in the negative X-direction with respect to the liquid supply tube 168b, and the fluid supply tube 132d and the fluid supply tube 134d are disposed on the side in the positive X-direction with respect to the liquid supply tube 168b. Therefore, the fluid supply tubes 132a and 132d and the fluid supply tubes 134a and 134d are disposed on the outer side with respect to the liquid supply tube 168a and the liquid supply tube 168b, and the fluid supply tubes 132b and 132c and the fluid supply tubes 134b and 134c are disposed between the liquid supply tube 168a and the liquid supply tube 168b.

In addition, the first fluid supply tube 132a and the second fluid supply tube 132b are disposed to face each other with the liquid supply tube 168a interposed therebetween, and the fifth fluid supply tube 134a and the sixth fluid supply tube 134b are disposed to face each other with the liquid supply tube 168a interposed therebetween. Similarly, the third fluid supply tube 132c and the fourth fluid supply tube 132d are disposed to face each other with the liquid supply tube 168b interposed therebetween, and the seventh fluid supply tube 134c and the eighth fluid supply tube 134d are disposed to face each other with the liquid supply tube 168b interposed therebetween.

In this manner, in a region of the substrate W on the side in the negative X-direction with respect to the imaginary centerline, a fluid from the first fluid supply unit 132 and a fluid from the second fluid supply unit 134 are supplied to both sides of the liquid supply tube 168a. Similarly, in a region of the substrate W on the side in the positive X-direction with respect to the imaginary centerline CL, a fluid from the first fluid supply unit 132 and a fluid from the second fluid supply unit 134 are supplied to both sides of the liquid supply tube 168b. Therefore, the substrate W can be sufficiently processed throughout the whole surface.

In the foregoing description referring to FIGS. 10 to 16, a gas is supplied as a fluid from each of the first fluid supply unit 132 and the second fluid supply unit 134 of the fluid supply unit 130. However, the present embodiment is not limited thereto. The fluid supply unit 130 may supply a liquid as a fluid.

Figure 17:
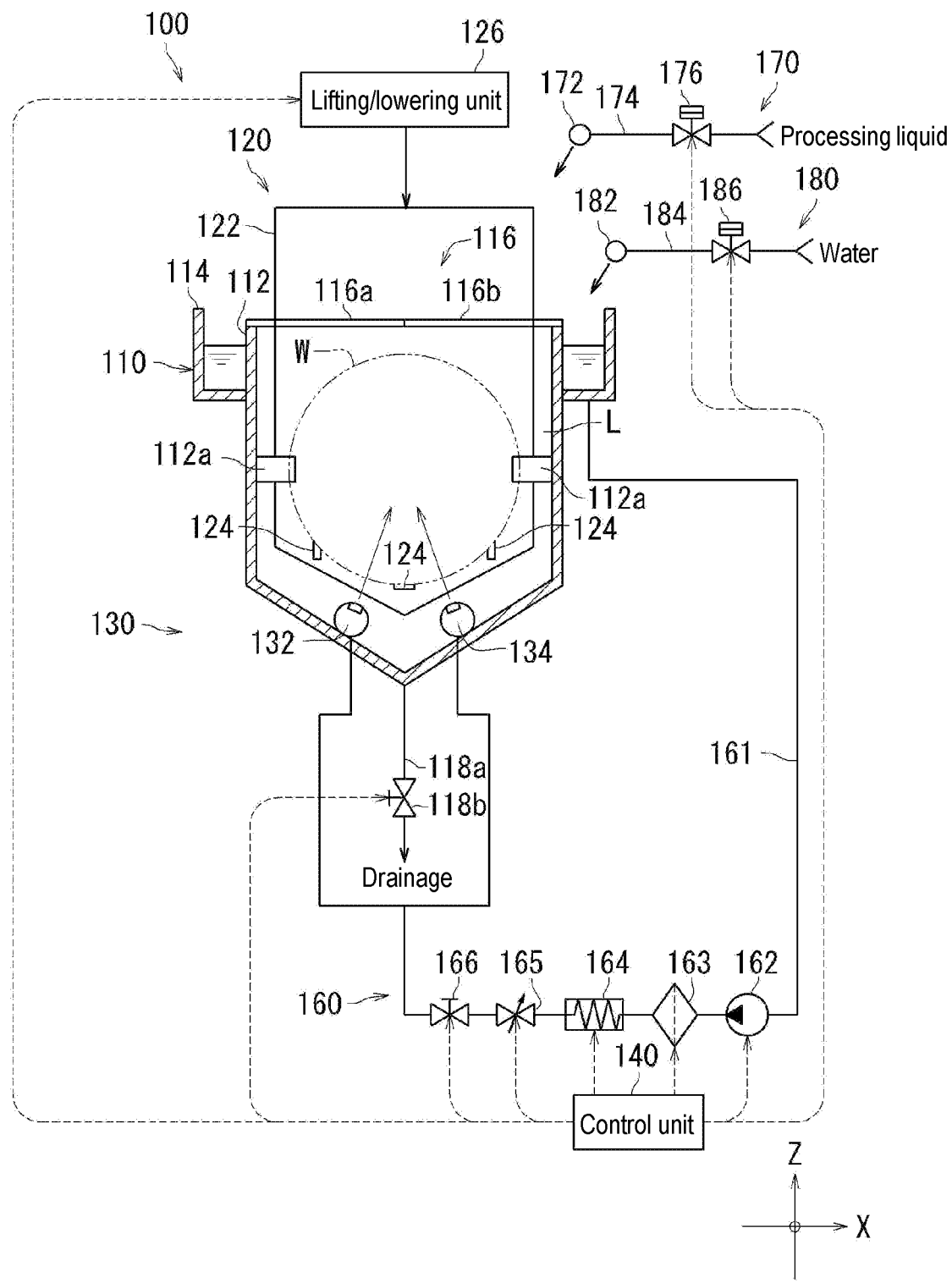
FIG. 17 is a schematic view of the substrate processing device of the present embodiment.

Next, with reference to FIG. 17, the substrate processing device 100 of the present embodiment will be described. FIG. 17 is a schematic view of the substrate processing device 100 of the present embodiment. The substrate processing device 100 illustrated in FIG. 17 is similar to the substrate processing device 100 described above with reference to FIG. 10 except that the fluid supply unit 130 supplies a liquid as a fluid. Therefore, duplicate description will be omitted to avoid redundancy.

The substrate processing device 100 includes the processing tank 110, the substrate holding unit 120, the fluid supply unit 130, and the control unit 140. The fluid supply unit 130 includes the first fluid supply unit 132 and the second fluid supply unit 134. The first fluid supply unit 132 and the second fluid supply unit 134 are disposed in the bottom portion of the inner tank 112 of the processing tank 110. The first fluid supply unit 132 and the second fluid supply unit 134 are connected to the downstream end of the piping 161. Here, the first fluid supply unit 132 and the second fluid supply unit 134 supply processing liquids which have circulated as fluids to the processing tank 110.

In the substrate processing device 100 illustrated in FIG. 17, the first fluid supply unit 132 and the second fluid supply unit 134 can separately adjust supply of the processing liquid L. FIG. 17 illustrates one adjustment valve 165 and one valve 166 in order to avoid excessively complicated drawings. However, a plurality of adjustment valves 165 or a plurality of valves 166 may be provided. Accordingly, the amounts of liquids supplied from the first fluid supply unit 132 and the second fluid supply unit 134 can be appropriately adjusted.

For example, the first fluid supply unit 132 supplies a circulated processing liquid to the processing liquid L inside the processing tank 110, and the second fluid supply unit 134 does not supply a circulated processing liquid to the processing liquid L inside the processing tank 110. Thereafter, the first fluid supply unit 132 does not supply a circulated processing liquid to the processing liquid L inside the processing tank 110, and the second fluid supply unit 134 supplies a circulated processing liquid to the processing liquid L inside the processing tank 110. Accordingly, a bias in processing of the substrate W can be curbed.

Figure 18A:
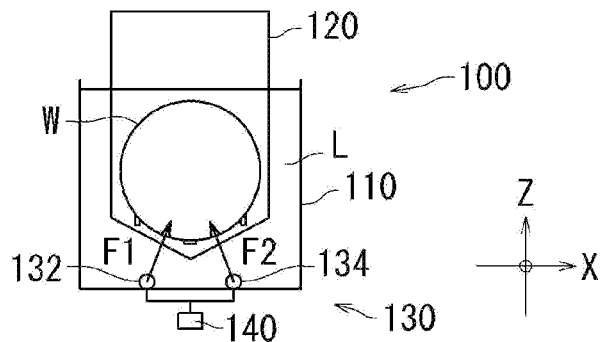
FIGS. 18A to 18C are schematic views for describing the substrate processing method of the present embodiment.
Figure 18B:
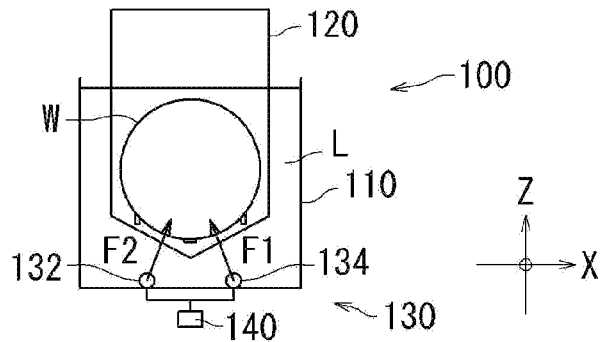
Figure 18C:
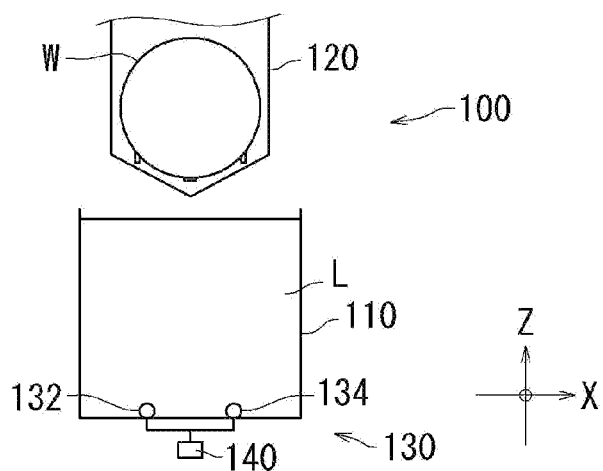

Next, with reference to FIGS. 18A to 18C, the substrate processing method of the present embodiment will be described. FIGS. 18A to 18C are schematic views for describing the substrate processing method of the present embodiment. The substrate processing method illustrated in FIGS. 18A to 18C is similar to the substrate processing method described above with reference to FIGS. 4A to 4C except that the first fluid supply unit 132 and the second fluid supply unit 134 change the flow rates of fluids while they continue to supply fluids. Therefore, duplicate description will be omitted to avoid redundancy.

As illustrated in FIG. 18A, in the substrate processing device 100, the substrate holding unit 120 causes the held substrate W to be immersed in the processing liquid L in the processing tank 110. The fluid supply unit 130 supplies a fluid to the processing tank 110 in a state where the substrate W is immersed in the processing liquid L. Here, the first fluid supply unit 132 and the second fluid supply unit 134 supply liquids to the processing tank 110. In FIG. 18A, supply of a liquid from the first fluid supply unit 132 to the processing tank 110 is indicated with an arrow F1, and supply of a liquid from the second fluid supply unit 134 to the processing tank 110 is indicated with an arrow F2.

As illustrated in FIG. 18B, while the substrate W held by the substrate holding unit 120 remains immersed in the processing liquid L in the processing tank 110, the fluid supply unit 130 changes supply of a fluid with respect to the substrate W. Here, the first fluid supply unit 132 and the second fluid supply unit 134 change the flow rates of liquids. In FIG. 18B, supply of a liquid from the first fluid supply unit 132 to the processing tank 110 is indicated with the arrow F2, and supply of a liquid from the second fluid supply unit 134 to the processing tank 110 is indicated with the arrow F1.

As illustrated in FIG. 18C, in the substrate processing device 100, the substrate W held by the substrate holding unit 120 is raised from the processing liquid L in the processing tank 110. The first fluid supply unit 132 and the second fluid supply unit 134 end supply of a liquid before, at the same time as, or after the substrate W is raised from the processing liquid L in the processing tank 110.

In the substrate processing device 100 illustrated in FIG. 17, a gas is supplied to the processing liquid L in the processing tank 110 from the fluid supply unit 130. However, the present embodiment is not limited thereto. Not only a gas from the fluid supply unit 130 but also a liquid may be supplied to the processing liquid L in the processing tank 110.

Figure 19:
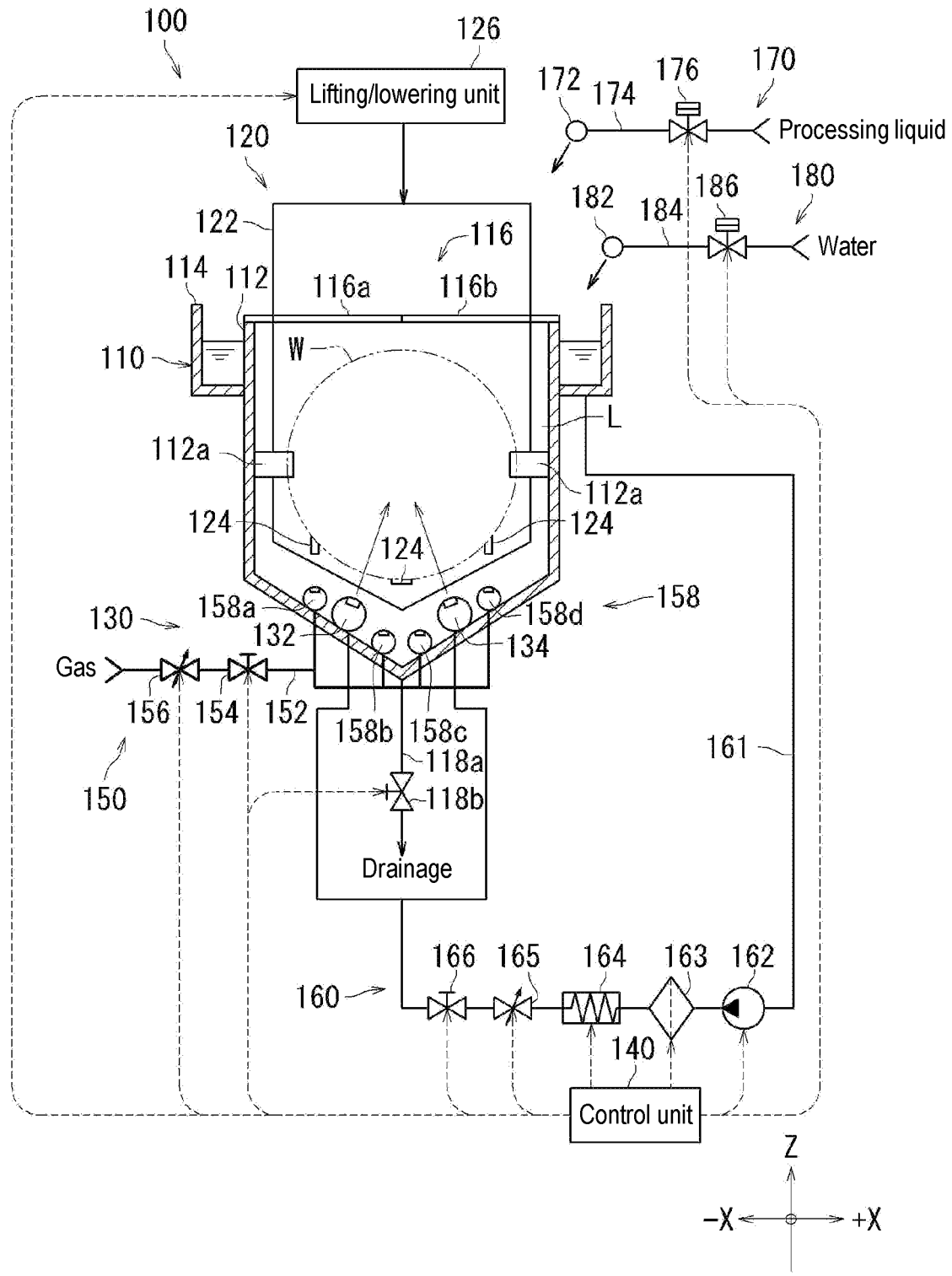
FIG. 19 is a schematic view of the substrate processing device of the present embodiment.

Next, with reference to FIG. 19, the substrate processing device 100 of the present embodiment will be described. FIG. 19 is a schematic view of the substrate processing device 100 of the present embodiment. The substrate processing device 100 illustrated in FIG. 19 is similar to the substrate processing device 100 described above with reference to FIG. 17 except that not only a liquid is supplied but also a gas is supplied to the processing tank 110 from the fluid supply unit 130. Therefore, duplicate description will be omitted to avoid redundancy.

The substrate processing device 100 further includes a gas supply unit 158, in addition to the processing tank 110, the substrate holding unit 120, the fluid supply unit 130, the control unit 140, and the gas conveyance unit 150. The gas supply unit 158 is disposed in the bottom portion of the inner tank 112 of the processing tank 110. The piping 152 is coupled to the gas supply unit 158. The piping 152 guides a gas to the gas supply unit 158 inside the processing tank 110.

The gas supply unit 158 includes a gas supply tubes 158a, 158b, 158c, and 158d. The gas supply tube 158a is disposed on a side in the negative X-direction with respect to the first fluid supply unit 132, and the gas supply tube 158b is disposed on a side in the positive X-direction with respect to the first fluid supply unit 132. The gas supply tube 158c is disposed on a side in the negative X-direction with respect to the second fluid supply unit 134, and the gas supply tube 158d is disposed on a side in the positive X-direction with respect to the second fluid supply unit 134.

In the substrate processing device 100 illustrated in FIGS. 18A to 18C, the gas supply unit 158 supplies a gas to the processing tank 110, in addition to that the first fluid supply unit 132 and the second fluid supply unit 134 supply liquids to the processing tank 110. Therefore, the substrate W can be sufficiently processed.

In the substrate processing device 100 illustrated in FIGS. 1 to 19, the fluid supply unit 130 is disposed in parallel to the normal direction of the main surface of the substrate W. However, the present embodiment is not limited thereto. The fluid supply unit 130 may extend in a direction orthogonal to the normal direction of the main surface of the substrate W.

Figure 20A:
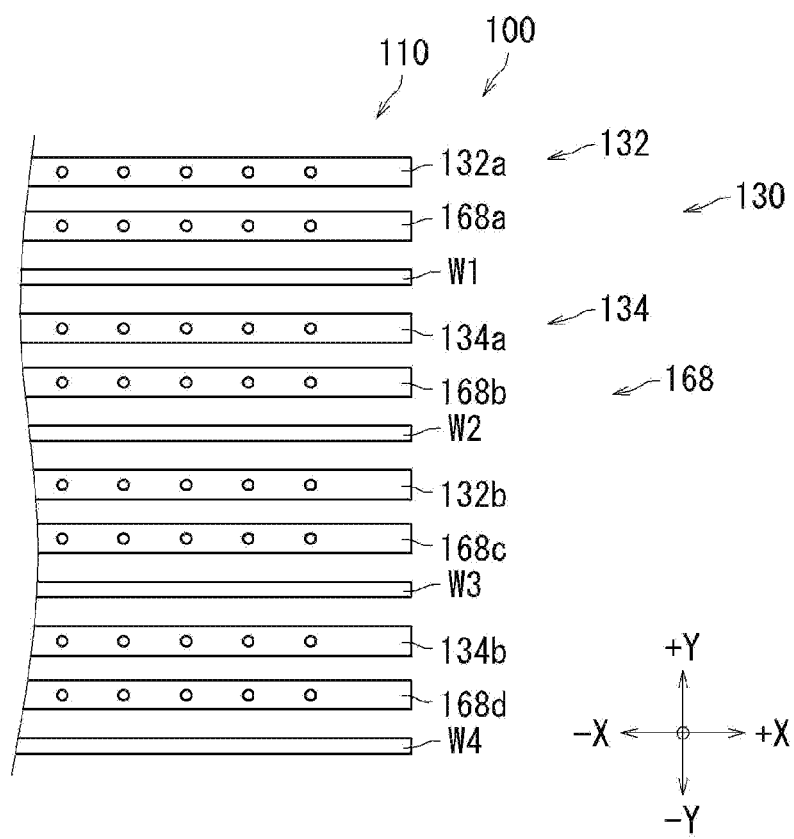
FIGS. 20A and 20B are schematic views of the substrate processing device of the present embodiment.
Figure 20B:
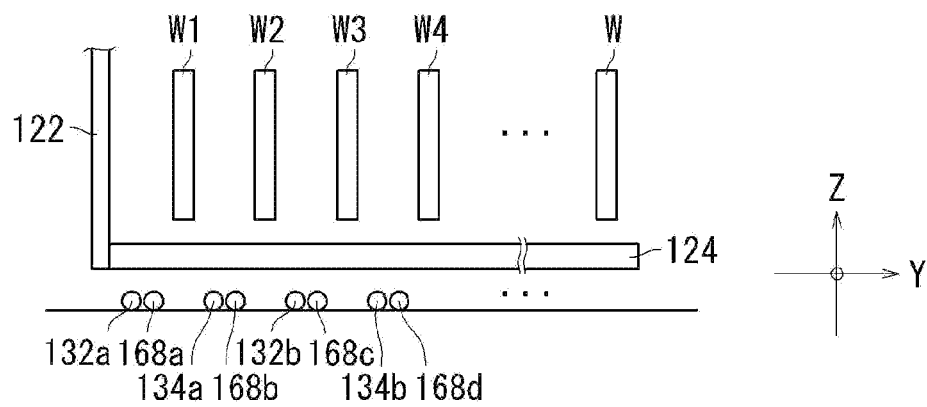

Next, with reference to FIGS. 20A and 20B, the substrate processing device 100 of the present embodiment will be described. FIG. 20A is a schematic top view of the processing tank 110 in the substrate processing device 100 of the present embodiment, and FIG. 20B is a schematic side view of the processing tank 110 in the substrate processing device 100 of the present embodiment. Here, the fluid supply unit 130 extends in a direction intersecting the direction in which the substrates W are arranged.

Similar to the substrate processing device 100 described above with reference to FIGS. 10 to 16, the fluid supply unit 130 and the liquid supply unit 168 are disposed in the processing tank 110 of the substrate processing device 100 illustrated in FIGS. 20A and 20B. Here, the fluid supply unit 130 extends in a direction intersecting the direction in which the substrates W are arranged. The fluid supply unit 130 is positioned between two adjacent substrates of a plurality of substrates W. The fluid supply unit 130 includes the first fluid supply unit 132 and the second fluid supply unit 134.

Here, the first fluid supply unit 132 and the second fluid supply unit 134 supply gases to the processing tank 110. The first fluid supply unit 132 includes the fluid supply tubes 132a and 132b, and the second fluid supply unit 134 includes the fluid supply tubes 134a and 134b. The first fluid supply unit 132 includes fluid supply tubes other than the fluid supply tubes 132a and 132b, and the second fluid supply unit 134 includes fluid supply tubes other than the fluid supply tubes 134a and 134b. However, in FIGS. 20A and 20B, only the fluid supply tubes 132a, 132b, 134a, and 134b are illustrated. The fluid supply tubes 132a and 132b and the fluid supply tubes 134a and 134b eject gases to the processing tank 110 through the ejection ports.

The liquid supply unit 168 supplies a liquid to the processing tank 110. The liquid supply unit 168 includes the liquid supply tubes 168a, 168b, 168c, and 168d. The liquid supply tubes 168a, 168b, 168c, and 168d eject liquids to the processing tank 110 through the ejection ports.

The fluid supply tubes 132a and 132b of the first fluid supply unit 132 are each arranged in every other substrate in the arrangement direction (Y-direction) of the substrates W. Similarly, the fluid supply tubes 134a and 134b of the second fluid supply unit 134 are each arranged at positions where the fluid supply tubes 132a and 132b are not disposed, that is, in every other substrate in the arrangement direction (Y-direction) of the substrates W. For example, the fluid supply tube of the first fluid supply unit 132 is disposed between the substrate W2 and the substrate W3 in a plan view and is provided to supply a gas to the substrate W2 and the substrate W3. On the other hand, the fluid supply tube of the second fluid supply unit 134 is provided between the substrate W1 and the substrate W2 in a plan view and is provided to supply a gas to the substrate W1 and the substrate W2.

On the other hand, the liquid supply tubes 168a, 168b, 168c, and 168d are disposed one by one between the substrates W in a plan view and are provided to supply processing liquids to places between the substrates W. For example, one liquid supply tube of the liquid supply unit 168 is disposed between the substrate W1 and the substrate W2 in a plan view and is similarly provided between the substrate W2 and the substrate W3 in a plan view.

In the substrate processing device 100 of the present embodiment, when only one of the first fluid supply unit 132 and the second fluid supply unit 134 supplies a gas, the gas is supplied to one of two main surfaces of the substrate W. For example, when the first fluid supply unit 132 supplies a gas, the main surface of the substrate W1 on a side in the positive Y-direction, the main surface of the substrate W2 on a side in the negative Y-direction, and the main surface of the substrate W3 on a side in the positive Y-direction come into contact with the gas. On the contrary, when the second fluid supply unit 134 supplies a gas, the main surface of the substrate W1 on a side in the negative Y-direction, the main surface of the substrate W2 on a side in the positive Y-direction, the main surface of the substrate W3 on a side in the negative Y-direction, and the main surface of a substrate W4 on a side in the positive Y-direction come into contact with the gas.

In addition, the liquid supply tubes 168a, 168b, 168c, and 168d of the liquid supply unit 168 supply liquids in any case. Therefore, both a liquid and a gas are supplied to each substrate W, so that the substrate W can be effectively processed.

In the foregoing description referring to FIGS. 20A and 20B, the liquid supply unit 168 supplies a liquid and the fluid supply unit 130 supplies a gas to the processing tank 110. However, the present embodiment is not limited thereto. The gas supply unit may supply a gas and the fluid supply unit 130 may supply a liquid to the processing tank 110. In this case, as described above with reference to FIG. 1, the fluid supply unit 130 may change supply of a liquid.

In addition, in the foregoing description referring to FIGS. 20A and 20B, the liquid supply unit 168 supplies a liquid and the first fluid supply unit 132 and the second fluid supply unit 134 supply gases to the processing tank 110. However, the present embodiment is not limited thereto. The gas supply unit may supply a gas and the first fluid supply unit 132 and the second fluid supply unit 134 may supply liquids to the processing tank 110. In this case, as described above with reference to FIGS. 17 and 18A to 18C, the first fluid supply unit 132 and the second fluid supply unit 134 may change the flow rates of liquids.

Figure 21A:
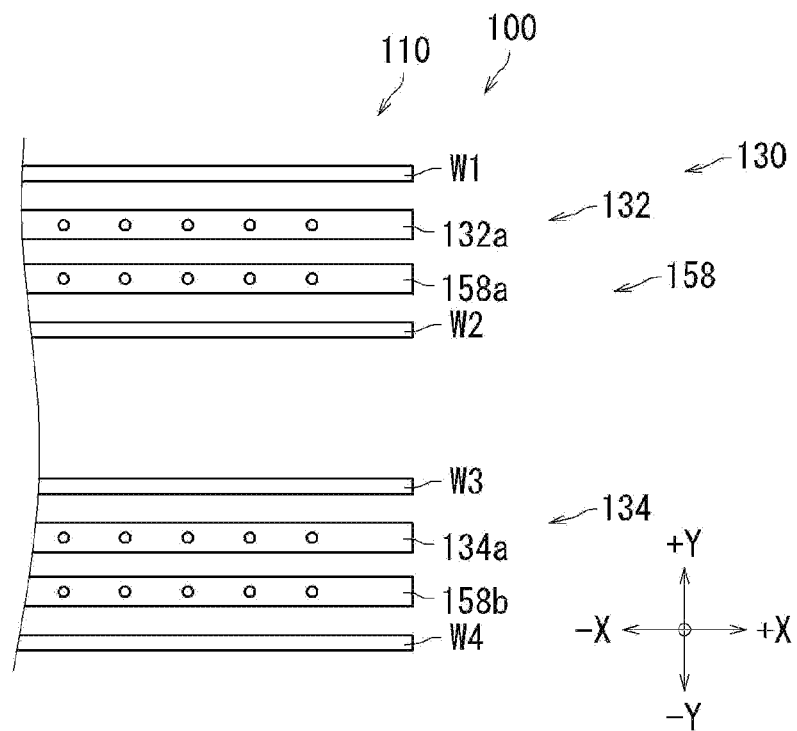
FIGS. 21A and 21B are schematic views of the substrate processing device of the present embodiment.
Figure 21B:
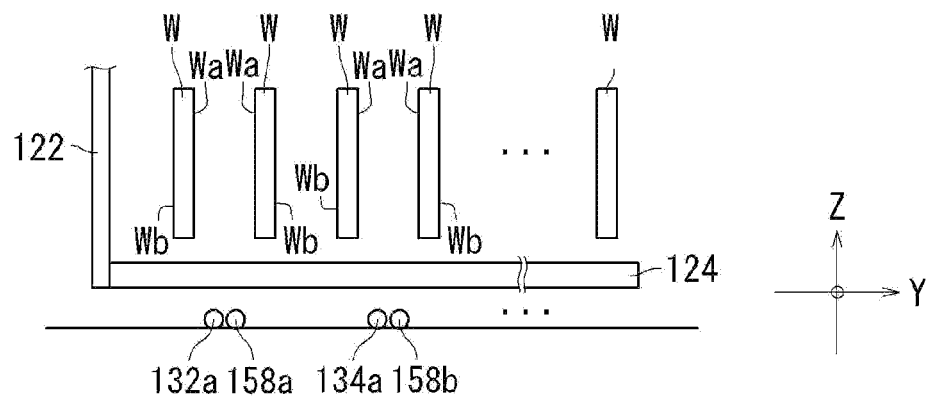

Next, with reference to FIGS. 21A and 21B, the substrate processing device 100 of the present embodiment will be described. FIG. 21A is a schematic top view of the processing tank 110 in the substrate processing device 100 of the present embodiment, and FIG. 21B is a schematic side view of the processing tank 110 in the substrate processing device 100 of the present embodiment.

Here, the main surfaces Wa of facing adjacent substrates W face each other, and the main surfaces Wb of facing adjacent substrates W face each other.

Similar to the substrate processing device 100 illustrated in FIG. 19, the fluid supply unit 130 and the gas supply unit 158 are disposed in the processing tank 110 of the substrate processing device 100 illustrated in FIG. 21A. The fluid supply unit 130 includes the first fluid supply unit 132 and the second fluid supply unit 134.

Here, the first fluid supply unit 132 supplies a liquid to the processing tank 110. The first fluid supply unit 132 includes the fluid supply tube 132a, and the second fluid supply unit 134 includes the fluid supply tube 134a. The first fluid supply unit 132 includes fluid supply tubes other than the fluid supply tube 132a, and the second fluid supply unit 134 includes fluid supply tubes other than the fluid supply tube 134a. However, in FIG. 21A, only the fluid supply tubes 132a and 134a are illustrated. The fluid supply tube 132a and the fluid supply tube 134a eject gases to the processing tank 110 through the ejection ports.

The gas supply unit 158 supplies a gas to the processing tank 110. The gas supply unit 158 includes the gas supply tubes 158a and 158b. The gas supply tubes 158a and 158b eject gases to the processing tank 110 through the ejection ports.

Any of the fluid supply tubes of the first fluid supply unit 132 and the fluid supply tubes of the second fluid supply unit 134 are arranged in every other substrate in the arrangement direction (Y-direction) of the substrates W. In addition, the fluid supply tubes of the first fluid supply unit 132 are arranged in every third substrate in the arrangement direction (Y-direction) of the substrates W, and the fluid supply tubes of the second fluid supply unit 134 are arranged in every third substrate in the arrangement direction (Y-direction) of the substrates W. For example, the fluid supply tube of the first fluid supply unit 132 is disposed between the substrate W1 and the substrate W2 in a plan view and is provided to supply a gas to the main surface Wa of the substrate W1 and the main surface Wa of the substrate W2. On the other hand, the fluid supply tube of the second fluid supply unit 134 is provided between the substrate W3 and the substrate W4 in a plan view and is provided to supply a gas to the main surface Wa of the substrate W3 and the main surface Wa of the substrate W4.

On the other hand, the gas supply tubes of the gas supply unit 158 are arranged in every other substrate in the arrangement direction (Y-direction) of the substrates W and are provided to supply gases to places between the substrates W. For example, one gas supply tube 158a of the gas supply unit 158 is disposed between the substrate W1 and the substrate W2 in a plan view. Similarly, the gas supply tube 158b is provided between the substrate W3 and the substrate W4 in a plan view.

In the substrate processing device 100 of the present embodiment, the first fluid supply unit 132 and the second fluid supply unit 134 supply liquids differ from each other in flow rate, and the liquids are supplied to the main surfaces Wa of adjacent substrates W. For example, when the flow rate of a liquid from the first fluid supply unit 132 is higher than the flow rate of a liquid from the second fluid supply unit 134, the main surface Wa of the substrate W1 and the main surface Wa of the substrate W2 are sufficiently processed. On the contrary, when the flow rate of a liquid from the second fluid supply unit 134 is higher than the flow rate of a liquid from the first fluid supply unit 132, the main surface Wa of the substrate W3 and the main surface Wa of the substrate W4 are sufficiently processed.

In addition, the gas supply tubes 158a, 158b, 158c, and 158d of the gas supply unit 158 supply gases in any case. Therefore, both a liquid and a gas are supplied to each substrate W, so that the main surface Wa of the substrate W can be effectively processed.

In the foregoing description referring to FIGS. 21A and 21B, the gas supply unit 158 supplies a gas and the first fluid supply unit 132 and the second fluid supply unit 134 supply liquids to the processing tank 110. However, the present embodiment is not limited thereto. The liquid supply unit may supply a liquid and the first fluid supply unit 132 and the second fluid supply unit 134 may supply gases to the processing tank 110.

As illustrated in FIGS. 20A, 20B, 21A, and 21B, it is preferable that a liquid and a gas be supplied to at least a part of each substrate W. Accordingly, each substrate W can be sufficiently processed.

When a plurality of substrates W are arranged in a row and processing of the substrates W is performed, the substrate W disposed at the end of the substrates W arranged in a row may not be uniformly processed compared to other substrates. Therefore, it is preferable to provide a straightening plate that faces the substrate W disposed at the end of the substrates W arranged in a row.

Figure 22A:
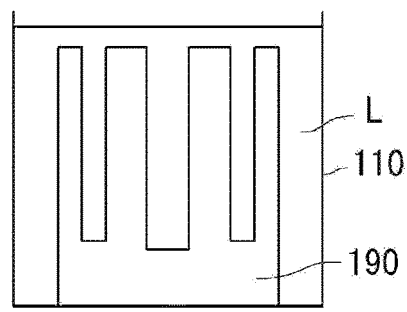
FIG. 22A is a schematic view of the processing tank in the substrate processing device of the present embodiment.
Figure 22B:
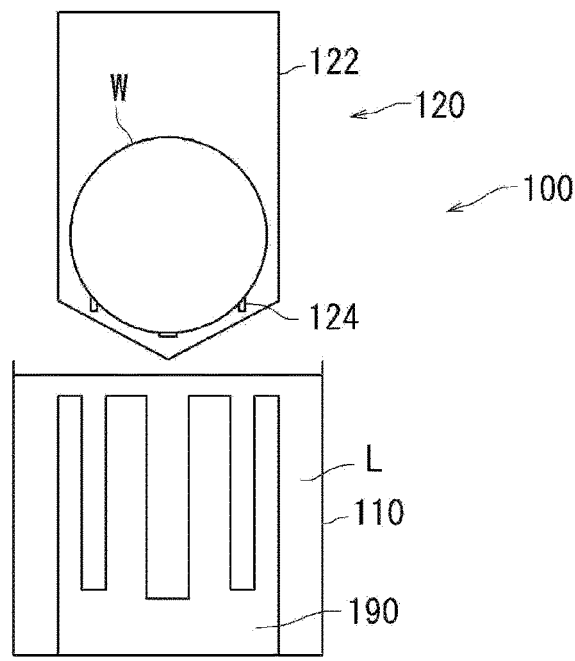
FIGS. 22B and 22C are schematic views for describing the substrate processing method of the present embodiment.
Figure 22C:
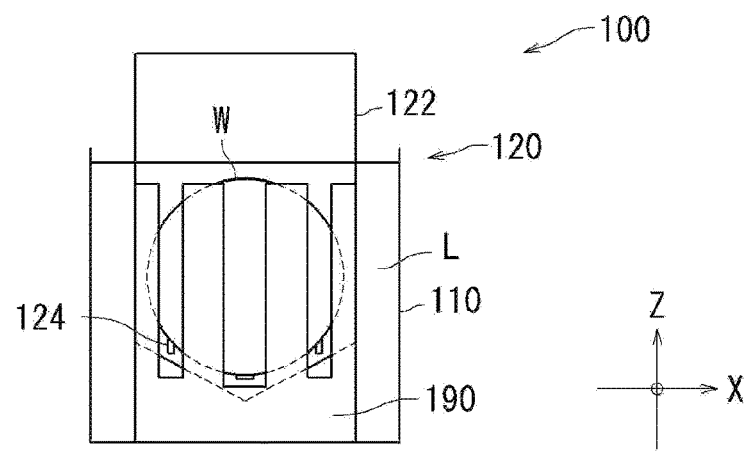

Next, with reference to FIGS. 22A to 22C, the substrate processing device 100 including the processing tank 110 to which a straightening plate 190 is attached will be described. FIG. 22A is a schematic view of the processing tank 110 in the substrate processing device 100 of the present embodiment. FIGS. 22B and 22C are schematic views for describing the substrate processing method of the present embodiment.

As illustrated in FIG. 22A, in the substrate processing device 100, the straightening plate 190 is attached to the processing tank 110. The straightening plate 190 is attached to the bottom portion of the processing tank 110. The straightening plate 190 is a plate extending vertically upward (Z-direction). Three depressions corresponding to the holding rods 124 of substrate holding unit 120 are provided in the straightening plate 190.

As illustrated in FIG. 22B, the substrate holding unit 120 holds the substrates W above the processing tank 110. A plurality of substrates W held by the substrate holding unit 120 are arranged in a row.

As illustrated in FIG. 22C, the substrate holding unit 120 goes down to the processing tank 110 while holding the substrates W. Accordingly, in the substrate processing device 100, a plurality of substrates W arranged in a row are immersed in the processing tank 110. The holding rods 124 of substrate holding unit 120 enter the depressions of the straightening plate 190. Therefore, when the substrate holding unit 120 goes down to the processing tank 110 while holding the substrates W, the straightening plate 190 faces the substrate W at one end of the substrates W arranged in a row. Therefore, the substrate W at one end of the substrates W arranged in a row can also be processed similar to other substrates.

In the substrate processing device 100 illustrated in FIGS. 22A to 22C, the straightening plate 190 is attached to the processing tank 110. However, the present embodiment is not limited thereto. The straightening plate 190 may be attached to the substrate holding unit 120.

Figure 23:
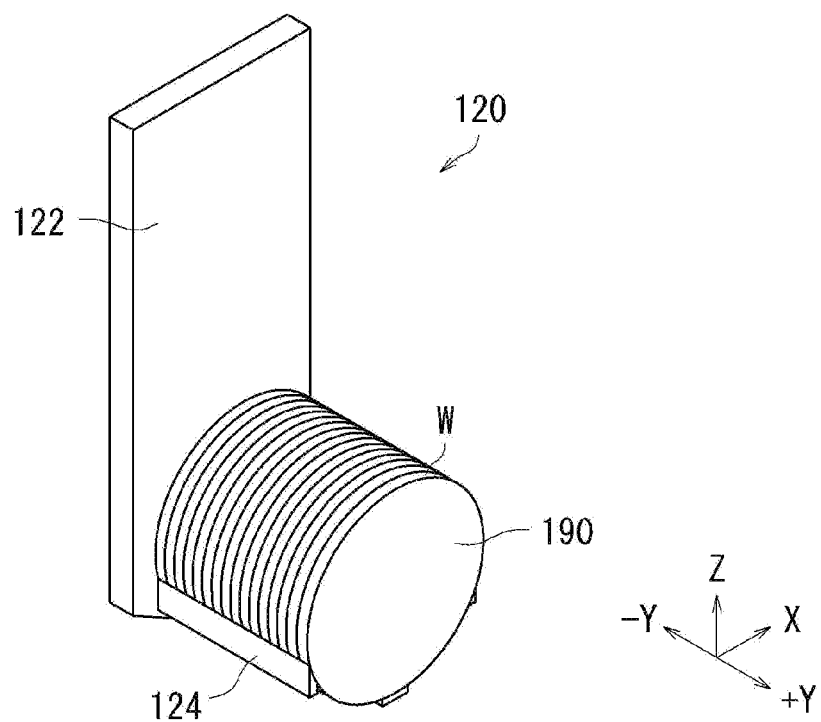
FIG. 23 is a schematic view of a substrate holding unit in the substrate processing device of the present embodiment.

Next, with reference to FIG. 23, the substrate holding unit 120 in the substrate processing device 100 of the present embodiment in which the straightening plate 190 is attached to the substrate holding unit 120 will be described. FIG. 23 is a schematic view of the substrate holding unit 120.

The substrate holding unit 120 includes the main body plate 122 and the holding rods 124. A plurality of substrates W are arranged and supported in a row in the Y-direction in the holding rods 124. The straightening plate 190 is attached to the end portion of the holding rods 124 on a side in the positive Y-direction. The straightening plate 190 faces the substrate W of the plurality of substrates W, on a side in the positive Y-direction. It is preferable that the diameter, the shape, and the thickness of the straightening plate 190 be substantially equivalent to those of the substrate W. For example, when the substrate W has a circular thin shape, it is preferable that the straightening plate 190 have a circular thin shape as well.

In addition, there are cases where the number of substrates W held by the substrate holding unit 120 is smaller than the maximum possible holding number. In this case, it is preferable that the straightening plate 190 be able to move in the Y-direction along the holding rods 124.

In the substrate processing device 100 described above with reference to FIGS. 1 to 23, the fluid supply unit 130 is disposed in the bottom portion of the processing tank 110 and supplies a fluid to a processing liquid stored in the processing tank 110. However, the present embodiment is not limited thereto. The fluid supply unit 130 may be disposed on a side of the processing tank 110. Alternatively, the fluid supply unit 130 may be disposed at a position higher than the level of a processing liquid stored in the processing tank 110 and may supply a fluid to the processing tank 110 without being covered by the processing liquid.

The substrate processing device 100 illustrated in FIGS. 1 to 23 is a batch-type processing device which performs processing of a plurality of substrates W at the same time. However, the present embodiment is not limited thereto. The substrate processing device 100 may be a single wafer-type processing device which performs processing of the substrate W one at a time.

Hereinabove, the embodiment of the disclosure has been described with reference to the drawings. However, the disclosure is not limited to the foregoing embodiment and can be realized in various forms within a range not departing from the gist thereof. In addition, various disclosures can be formed by suitably combining a plurality of constituent elements disclosed in the foregoing embodiment. For example, some constituent elements may be deleted from all of the constituent elements described in the embodiment. Moreover, constituent elements of different embodiments may be suitably combined. In order to facilitate the understanding, the drawings are schematically illustrated mainly regarding each of the constituent elements. There are cases where the thickness, the length, the number, the interval, and the like of each of the illustrated constituent elements are different from those of the actual constituent elements for the convenience of preparing the drawings. In addition, the material, the shape, the dimensions, and the like of each of the constituent elements illustrated in the foregoing embodiment are merely examples and are not particularly limited. Various changes can be made within a range not practically departing from the effects of the disclosure.

What is claimed is:

1. A substrate processing method comprising:
   a step of providing a processing tank inside which a first fluid supply unit for supplying a fluid to the processing tank, a second fluid supply unit for supplying a fluid to the processing tank, and a liquid supply unit for supplying a liquid to the processing tank are disposed;
   a step of storing a processing liquid in the processing tank;
   a step of immersing at least one substrate in the processing liquid stored in the processing tank; and
   a step of performing fluid supply to the processing tank, wherein
   in the step of providing a processing tank,
      the liquid supply unit is configured below a location of the at least one substrate in the processing liquid in the step of immersing the at least one substrate,
      the liquid supply unit includes:
         a first liquid supply tube configured at one side with respect to a vertical central axis of the at least one substrate; and a second liquid supply tube configured at another side with respect to the vertical central axis of the at least one substrate, the first liquid supply tube is configured with first ejection ports directed to the at least one substrate with inclination with respect to the vertical central axis of the at least one substrate, the second liquid supply tube is configured with second ejection ports directed to the at least one substrate with inclination with respect to the vertical central axis of the at least one substrate, the first fluid supply unit includes a first fluid supply tube and a second fluid supply tube, the second fluid supply unit includes a third fluid supply tube and a fourth fluid supply tube, the first fluid supply tube is configured between the vertical central axis of the at least one substrate and the first liquid supply tube, the second fluid supply tube is configured between the vertical central axis of the at least one substrate and the second liquid supply tube, the first liquid supply tube is configured between the third fluid supply tube and the first fluid supply tube, and the second liquid supply tube is configured between the fourth fluid supply tube and the second fluid supply tube, the step of performing fluid supply includes:

supplying, in a first timing, a gas as the fluid to the processing tank by the first fluid supply tube and the second fluid supply tube of the first fluid supply unit while supplying the liquid to the processing tank by the first liquid supply tube and the second liquid supply tube with the at least one substrate immersed in the processing liquid in the processing tank; and supplying, in a second timing, the fluid to the processing tank by the third fluid supply tube and the fourth fluid supply tube of the second fluid supply unit while supplying the liquid to the processing tank by the first liquid supply tube and the second liquid supply tube with the at least one substrate immersed in the processing liquid in the processing tank, the second timing being different from the first timing.

2. The substrate processing method according to claim 1, wherein in the step of providing a processing tank, the first fluid supply tube and the second supply tube are symmetrically disposed with respect to the vertical central axis of the at least one substrate.

3. The substrate processing method according to claim 1, wherein in the step of providing a processing tank, the third fluid supply tube and the fourth supply tube are symmetrically disposed with respect to the vertical central axis of the at least one substrate.

4. The substrate processing method according to claim 1, wherein in the step of providing a processing tank, the first liquid supply tube and the second liquid supply tube are symmetrically disposed with respect to the vertical central axis of the at least one substrate.

5. The substrate processing method according to claim 1, wherein in the step of providing a processing tank, the at least one substrate comprises a plurality of substrates arranged in a row, each of the first ejection ports of the first liquid supply tube is located between adjacent two substrates of the plurality of substrates, and each of the second ejection ports of the second liquid supply tube is located between adjacent two substrates of the plurality of substrates.

6. The substrate processing method according to claim 1, wherein in the first timing, the first fluid supply tube and the second fluid supply tube of the first fluid supply unit supply the gas as the fluid to the processing tank while the third fluid supply tube and the fourth fluid supply tube of the second fluid supply unit do not supply the gas as the fluid to the processing tank, and in the second timing, the third fluid supply tube and the fourth fluid supply tube of the second fluid supply unit supply the gas as the fluid to the processing tank while the first fluid supply tube and the second fluid supply tube of the first fluid supply unit do not supply the gas as the fluid to the processing tank.

7. The substrate processing method according to claim 1, wherein the step of performing fluid supply further includes changing a flow of the processing liquid in the processing tank by switching a supply of the gas in the first timing to and from the supply of the gas in the second timing.

* * * * *